(12) United States Patent
Tominaga

(10) Patent No.: US 8,531,159 B2
(45) Date of Patent: Sep. 10, 2013

(54) BATTERY MANAGEMENT CONTROL SYSTEM

(75) Inventor: Yuki Tominaga, Okazaki (JP)

(73) Assignee: Mitsubishi Jidosha Kogyo Kabushiki Kaisha, Tokyo (JP)

( * ) Notice: Subject to any disclaimer, the term of this patent is extended or adjusted under 35 U.S.C. 154(b) by 611 days.

(21) Appl. No.: 12/395,117

(22) Filed: Feb. 27, 2009

(65) Prior Publication Data
US 2009/0218987 A1 Sep. 3, 2009

(30) Foreign Application Priority Data
Feb. 29, 2008 (JP) .................................. 2008-050523

(51) Int. Cl.
*H02J 7/00* (2006.01)
(52) U.S. Cl.
USPC ........................................ 320/136; 320/134
(58) Field of Classification Search
None
See application file for complete search history.

(56) References Cited

U.S. PATENT DOCUMENTS

| 7,315,789 B2 * | 1/2008 | Plett .............................. 320/136 |
| 2001/0033170 A1 * | 10/2001 | Meissner et al. ............... 324/426 |
| 2007/0001679 A1 * | 1/2007 | Cho et al. ...................... 324/426 |
| 2007/0247106 A1 * | 10/2007 | Kawahara et al. ............. 320/104 |

FOREIGN PATENT DOCUMENTS

JP 2004-6191 A 1/2004

* cited by examiner

*Primary Examiner* — Edward Tso
*Assistant Examiner* — Robert Grant
(74) *Attorney, Agent, or Firm* — Birch, Stewart, Kolasch & Birch, LLP

(57) ABSTRACT

A battery management control system includes: a battery, including: a battery cell; a battery cell monitor, detecting information on the battery cell; and a manager, controlling input/output of electric power to/from the battery cell based on the information; and a controller. One of the manager and the controller includes a first map specifying a first upper limit of the electric power and a second map specifying a second limit lower than the first limit. The controller calculates a first electric power value based on the first map and requests the first electric power value. When the manager controls the input/output of the electric power to/from the battery cell based on the first electric power value, and the information satisfies a deterioration determination condition, the manager determines that the battery cell is deteriorated, and the controller calculates a second electric power value based on the second map.

19 Claims, 30 Drawing Sheets

BATTERY MANAGEMENT CONTROL SYSTEM

BACKGROUND OF THE INVENTION

1. Field of the Invention

The present invention relates to a battery management control system for controlling input and output of a battery used as a power supply of, for example, an electric vehicle in association with deterioration of the battery.

2. Description of the Related Art

Electric vehicles install therein batteries as power supplies for driving. The battery includes a plurality of battery cells, a battery case which stores the battery cells and the like.

Lithium ion secondary batteries are used as an example of a battery. A battery includes a plurality of secondary batteries (battery cells), and a voltage sensor and a temperature sensor are provided for each battery cell. The voltage sensors and temperature sensors are connected to a vehicle control unit, and the vehicle control unit detects output voltage values and input voltage values of the respective battery cells, as well as temperatures of the respective battery cells.

In the battery that is configured as has been described above, its maximum output value (W) and maximum input value (W) are changed by its charging rate. Note that the maximum input value means a maximum value of electric power that can be inputted into each battery cell to charge the battery cell by a regenerative brake system when the speed of an electric vehicle is reduced.

The maximum output value of each battery cell increases more as the charging rate of the battery or the charging rate of the battery cell becomes closer to full charge. When the charging rate becomes smaller, the maximum output value becomes smaller. On the contrary, the maximum input value of each battery cell becomes smaller as the charging rate of the battery cell becomes closer to full charge, and when the charging rate becomes smaller, the maximum input value becomes larger.

The maximum output value and maximum input value of the battery are stored on the maps. The maximum output electric power value of the battery shown on the map means a total sum of respective maximum electric power values that the battery cells installed in the battery can output. The maximum input electric power value of the battery shown on the map means a total sum of respective maximum electric power values that can be inputted into the battery cells installed in the battery. The maximum output value and maximum input value of the battery are managed by the maps.

When the output voltage of the battery cell becomes smaller than its lower limit value (when the output voltage of the battery cell becomes a cut-off voltage), there occurs a situation in which the battery cell fails. When the input voltage of the battery cell becomes larger than its upper limit value (when the input voltage of the battery cell becomes a cut off voltage), there occurs a situation in which the battery cell fails.

The vehicle control unit stops supplying electric power to the motor when detecting from detection results of output voltage values and input voltage values of the respective battery cells by the respective voltage sensors that the output voltage values of the respective battery cells become their lower limit values (their cut-off voltages). In addition, the vehicle control unit stops supplying electric power to the respective battery cells.

On the other hand, the battery cells deteriorate as a result of being used. Specifically, the maximum output values and maximum input values of the battery cells at respective charging rates and temperatures are reduced.

The deterioration of the battery cells produces a difference between the maps which show the maximum output value and maximum input value of the battery and the actual performance of the battery (the maximum output electric power value that can be outputted by the battery and the maximum input electric power value that can be inputted into the battery).

It is considered that even in such a state that the maximum output value or maximum input value has not yet been reached on the map, by the deterioration of the respective battery cells, the maximum output electric power values or maximum input electric power values of the respective battery cells reach the cut-off voltage value (the output voltages become smaller than the lower limit value or the input voltages become larger than the upper limit value). Because of this, it is not preferable that there is produced a difference between the performance of the battery shown on the maps and the actual performances of the respective battery cells (the actual performance of the battery).

To cope with this, it has been practice to optimize the maps to mach the deteriorated battery. As one of the related arts of this type, the optimization of the maps is implemented by estimating deteriorations of the respective battery cells from a length of time when the battery has been used (for example, refer to JP-A-2004-6191).

When looking into causes for deterioration of the respective battery cells, the battery is affected by time over which the battery has been used and environment in which the battery is used. Temperature can be raised as one of causes related to the environment.

However, JP-A-2004-6191 discloses the related art for estimating deteriorations of the respective battery cells from time over which they have been in use. Because of this, depending upon an environment where the battery is used, it is considered that the deterioration of the battery cells is developed to a further advanced state than the estimated deterioration thereof from the time.

In such a state, since there is being produced a difference between the performance shown in the maps and the actual performance of the battery, it is considered that the output voltage values and input voltage values of the respective battery cells become the cut-off voltage value frequently, and every time the cut-off voltage is reached, the motor of the electric vehicle is stopped.

SUMMARY OF THE INVENTION

It is therefore an object of the invention to provide a battery management control system which can suppress the occurrence of a difference between the performance of the battery shown on the maps and the actual performance of the battery.

In order to achieve the object, according to the invention, there is provided a battery management control system, provided in an electric vehicle which is provided with electronic equipment including at least a driving electric motor, the battery management control system comprising:

a battery, comprising:
  a battery cell;
  a battery sell monitor, configured to detect information on the battery cell; and
  a manager, configured to control input and output of electric power to and from the battery cell based on the information; and a controller, connected to the electronic equipment, wherein:

one of the manager and the controller includes a map including a first map which specifies a first upper limit of the electric power and a second map which specifies a second limit of the electric power lower than the first limit;

the controller calculates a first electric power value based on the first map and requests the calculated first electric power value from the manager; and when the manager controls the input and the output of the electric power to and from the battery cell based on the requested first electric power value, and the information detected by the battery cell monitor satisfies a deterioration determination condition at least one time, the manager determines that the battery cell is deteriorated, and the controller calculates a second electric power value based on the second map.

The manager may include the map. When the manager determines that the battery cell is deteriorated, the manager changes the first map to the second map.

The controller may include the map. When the manager determines that the battery cell is deteriorated, the manager outputs a request to the controller to change the first map, and the controller changes the first map to the second map in response to the request.

The deterioration determination condition may include at least one of the conditions that an input voltage to the battery cell is larger than an upper limit voltage value in the input of the electric power to the battery cell, that an output voltage from the battery cell is smaller than a lower limit voltage value in the output of the electric power from the battery cell, and that maximum input and output electric powers based on the map are not to be held for a period of time.

The information detected by the battery cell monitor may include voltage and temperature of the battery cell.

The map may include a plurality of maps in accordance with degree of deterioration of the battery cell.

The map may include a third map which indicates maximum electric power input and output values corresponding to a charging rate of the battery cell which is not deteriorated, and a fourth map which indicates maximum electric power input and output values corrected by multiplying the maximum electric power input and output values indicated by the third map by a gain in accordance with degree of deterioration of the battery cell.

DETAILED DESCRIPTION OF THE INVENTION

Figure 1:
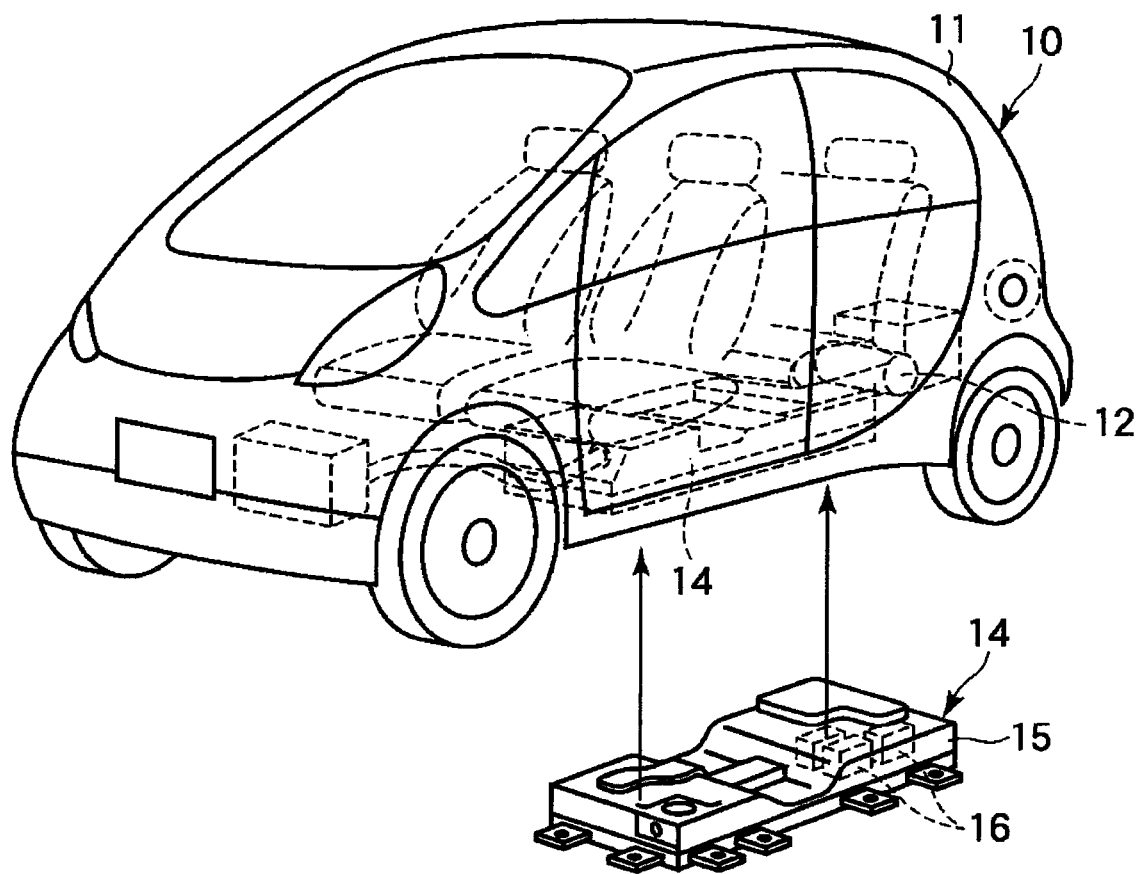
FIG. 1 is a perspective view showing an electric vehicle which includes a battery management control system according to a first embodiment of the invention.
Figure 2:
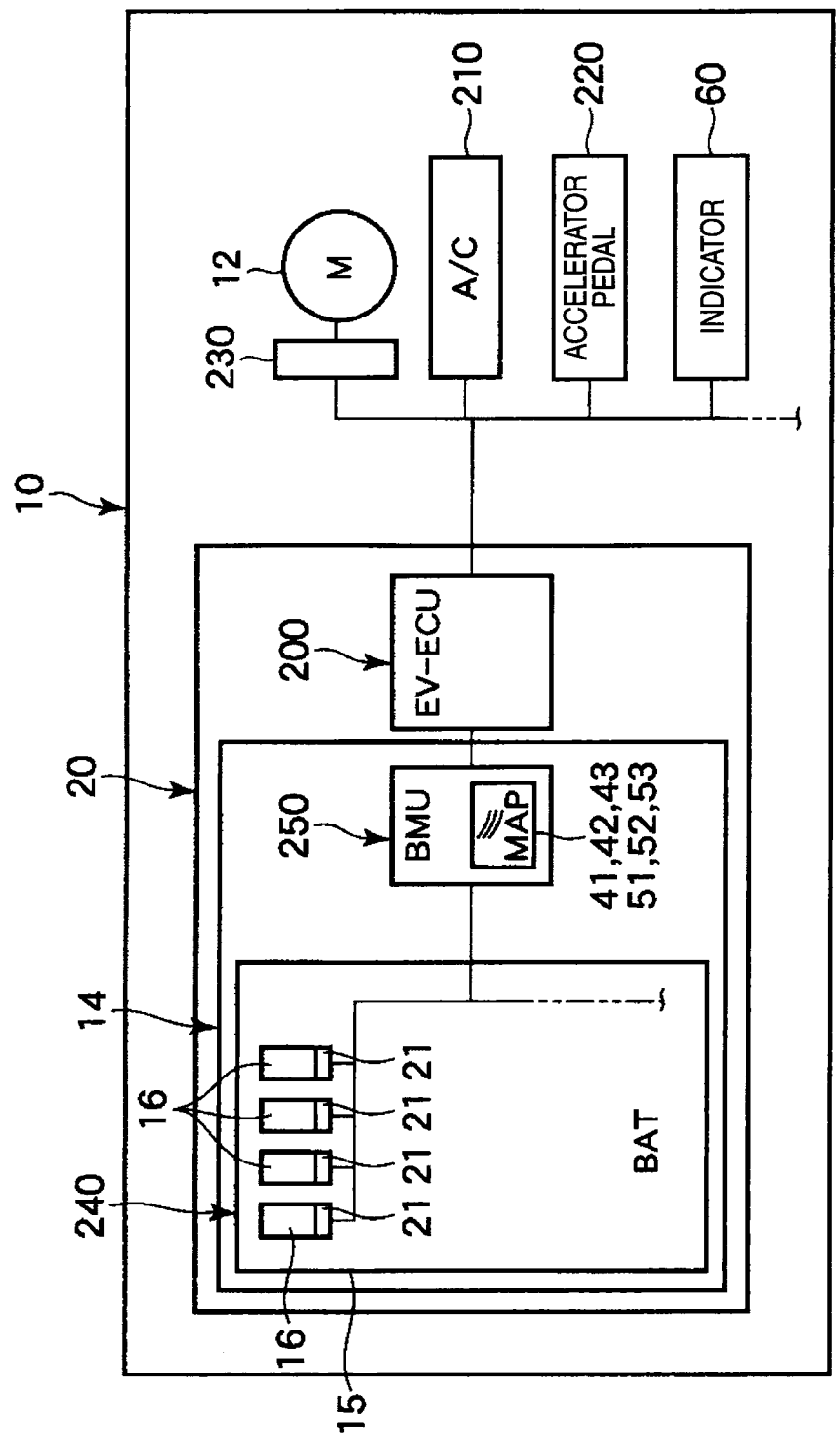
FIG. 2 is a block diagram schematically showing the electric vehicle shown in FIG. 1.

A battery management control system according to a first embodiment of the invention will be described by the use of FIGS. 1 to 9. FIG. 1 shows an electric vehicle 10. FIG. 2 is a schematic block diagram of the electric vehicle 10.

As is shown in FIGS. 1, 2, the electric vehicle 10 includes a running motor 12 which is disposed at a rear part of a vehicle body 11 and a battery management control system 20. The motor 12 is an example of the driving electric motor referred to in the invention. The battery management control system 20 includes a battery 14 which is disposed under a floor of the vehicle body 11 and an electric vehicle (electronic) control unit (EV-ECU) 200. FIG. 1 shows a state in which the battery 14 is removed from the vehicle body 11. The battery 14 indicated by broken lines shows a state in which the battery 14 is installed in the vehicle body 11.

In addition, in this embodiment, while the battery 14 is disposed underneath the floor of the vehicle body 11, the invention is not limited thereto. For example, the battery 14 may be disposed on the floor of the vehicle body 11. In addition, while the motor 12 is disposed further rearwards than a passenger compartment (a space in which occupants are seated), the invention is not limited thereto. The motor 12 may be disposed further forwards than the passenger compartment.

As is shown in FIG. 2, the battery 14 is electrically connected to the electric vehicle control unit 200. The electric vehicle control unit 200 is electrically connected to the motor 12, an air conditioner (A/C) 210, an accelerator pedal 220, an indicator 60 and the like. The electric vehicle control unit 200 is electrically connected with the motor 12 via an inverter 230.

The motor 12 and the air conditioner 210 constitute an example of the electronic equipment referred to in the invention. The electric vehicle control unit 200 is not limited to the electrical connection with only the motor 12 and the air conditioner 10. In reality, the electric vehicle control unit 200 is electrically connected to all electronic equipment (electronic equipment using the battery 14 as their driving source) which is installed in the electric vehicle 10 and calculates input and output values of electric power that is required by the respective types of electronic equipment. In this embodiment, as examples of the electronic equipment, the air conditioner 210 and the motor 12 is used for description of the embodiment.

Electric power that is required by the electronic equipment is, for example, electric power necessary to activate to operate electronic equipment when an operator (an occupant such as the driver) pushes on a switch for the electronic equipment.

In addition, the electric vehicle control unit 200 is connected to the accelerator pedal 220. Information on the operation of the accelerator pedal 220 (information on the amount and speed of depression of the accelerator pedal 220) is transmitted to the electric vehicle control unit 200. The electric vehicle control unit 200 calculates based on the operation information an electric power value which corresponds to the information in question (in such a manner that the vehicle can be accelerated in association with the amount of depression of the accelerator pedal 220, or the like).

The battery 14 constitutes the driving source of the electronic equipment (including the motor 12 and the air conditioner 210) which is installed in the electric vehicle 10. Although not illustrated, the battery 14 supplies electric power to various types of devices which are installed within the electric vehicle 10 via the electric vehicle control unit 200. The battery 14 includes a battery main body 240 and a battery management unit (BMU) 250.

The battery main body 240 includes a battery case 15, a plurality of battery cells 16 which are stored within the battery case 15, and a plurality of battery cell monitoring parts 21. The battery cells 16 are made up of, for example, lithium ion secondary batteries. The respective battery cells 16 are connected in series with each other.

The battery 14 can be used repeatedly by charging the respective battery cells 16. In addition, in FIG. 2, part of all the battery cells 16 so provided is shown, and the remaining battery cells 16 are omitted from the illustration but are indicated by a chain double-dashed line.

The battery cell monitoring parts 21 are attached respectively to the battery cells 16 one by one. The battery cell monitoring part 21 includes, for example, a voltage sensor and a temperature sensor. The battery cell monitoring part 21 detects a voltage value (an output voltage value) of electric power that is outputted from the battery cell 16 to which the battery cell monitoring part 21 is attached and a voltage value (an input voltage value) of electric power which is supplied to the battery cell 16 in question, that is, by which the battery cell 16 in question is charged. In addition, the battery cell monitoring part 21 detects an amount of residual electric energy (a charging rate) of the battery cell 16 to which the battery cell monitoring part 21 in question is attached. Additionally, the battery cell monitoring part 21 detects a temperature of the battery cell 16 to which the battery cell monitoring part 21 in question is attached. Furthermore, the battery cell monitoring part 21 detects input and output electric power values of the corresponding battery cell 16.

The battery management unit 250 is connected to all the battery cells 16 and all the battery monitoring parts 21. Information from all the battery cell monitoring parts 21 are inputted into the battery management unit 250, and the information includes specifically input and output voltage values of the battery cells 16, charging rates of the battery cells 16, output electric power values of the battery cells 16, input electric power values of the battery cells 16 and temperatures of the battery cells 16.

The battery management unit 250 grasps conditions of the respective battery cells 16 based on the aforesaid information (the information from the battery cell monitoring parts 21) and detects an output electric power value outputted from the battery 14, detects, an input electric power value inputted into the battery 14 and controls input and output of electric power into and from the battery cells 16. A line indicating the connection between the battery cell monitoring parts and the battery management unit 250 is partially omitted.

In addition, the battery management unit 250 is connected to the electric vehicle control unit 200. The battery management unit 250 includes a plurality of output control maps and a plurality of input control maps which are used electric power is inputted into and outputted from the battery 14. An output value of the battery 14 means a total value of electric power that is outputted from the respective battery cells 16. An input value of the battery 14 means a total value of electric power that is inputted into the respective battery cells 16. Values of electric power that is outputted from the respective battery cells 16 are set to become the same as each other. Value of electric power that is inputted into the respective battery cells 16 are set to become the same as each other.

The output control maps show a maximum output electric power value (W) that the battery 14 could output (the battery 14 is considered to be able to output), and the maximum output electric power value (W) is calculated in association with the charging rate of the battery 14. The maximum output electric power value that is shown on the output control maps is a theoretical value.

The charging rate of the battery 14 is the same as a charging rate of each battery cell 16. However, since the battery cells 16 are individually different from one another, it is considered that there may be produced a situation in which the charging rates of the battery cells 16 are not the same. In this embodiment, as an example, the battery management unit 250 takes as the charging rate of the battery 14 the charging rate of the battery cell 16 which constitutes a lowest (smallest) charging rate in the charging rates of the battery cells 16 based on the information sent thereto from the battery cell monitoring parts 21.

The maximum output electric power value shown on the maps is a total of output amounts of electric power that is outputted from the respective battery cells 16 when voltage values of voltage that is outputted from the respective battery cells 16 become a lower limit voltage value. Here, the maximum output electric power value shown on the maps is based on the assumption that output voltage values of the respective battery cells are the same and change in a similar way and constitutes an output electric power value resulting when the respective battery cells 16 become the lower limit voltage value at the same time.

In addition, in this embodiment, the lower limit voltage value is, as an example, a value which triggers the failure of the battery cells 16 when the output voltages of the battery cells 16 become smaller than the lower limit voltage value (the lower limit voltage value being not included). This value is a specific value to the battery cells 16 and is determined in advance.

However, the maximum output electric power value is not limited to the aforesaid example. For example, in order to avoid the failure of the battery cells 16, a total of output electric power that is outputted from the respective battery cells 16 when the output voltage values of the battery cells 16 are values which are larger by a predetermined value than the lower limit voltage value may be made to constitute the maximum output electric power value.

When the battery 14 outputs electric power, the output of the battery 14 is controlled using the output control maps in such a manner that the output value of the battery 14 does not exceed the maximum output electric power value shown on the maps.

When electric power that is outputted from the battery 14 becomes larger than the maximum output electric power value shown on the output control maps, the battery management unit 250 stops supplying electric power to the motor 12 or controls in such a manner that the output value of electric power that is outputted from the battery 14 converges to the maximum electric power output value. This is because when the output value of electric power that is outputted from the battery 14 becomes larger than the maximum output electric power value, the output voltage values of the battery cells 16 become smaller than the lower limit voltage value. When the output voltage values become smaller than the lower limit voltage value (a value which does not include the lower voltage value and which is smaller than the lower limit voltage value; when the output voltage values become the cut-off voltage), this will cause a failure of the battery cells 16.

In addition, electric power of the battery cells 16 is not such as to be supplied only to the motor 12. The aforesaid required output electric power is a total value of electric power that is required by not only the motor 12 but also all the other electronic equipment and devices.

The input control maps show a maximum input electric power value (W) that could be inputted into the battery 14 (that is considered to be able to be inputted into the battery 14), and the maximum input electric power value (W) is calculated in association with the charging rate of the battery 14. The maximum input electric power value shown on the maps is a total of input amounts of electric power that would be inputted (that is considered to be able to be inputted) into the respective battery cells 16 when voltage values of voltage that is inputted into the respective battery cells 16 become an upper limit voltage value. Here, the maximum input electric power value shown on the maps is based on the assumption that input voltage values inputted into the respective battery cells 16 are the same and change in a similar way and constitutes an input electric power value resulting when the respective battery cells 16 become the upper limit voltage value at the same time.

Namely, the maximum input electric power value shown in the input control maps is a theoretical value. Electric powers which are inputted into the respective battery cells when charging the battery 14 are made to become the same as one another.

The upper limit voltage value is a value which triggers the failure of the battery cells 16 when the input voltages of the battery cells 16 become larger than the value (the upper limit voltage value is not included). This upper limit voltage value is a specific value to the respective battery cells 16 and is determined in advance.

However, the maximum input electric power value is not limited to the aforesaid example. For example, in order to avoid the failure of the battery cells 16, a total of input electric power that is inputted into the respective battery cells 16 when the input voltage values of the battery cells 16 are values which are smaller by a predetermined value than the upper limit voltage value may be made to constitute the maximum input electric power value.

When electric power is inputted into the battery 14, the input into the battery 14 is controlled using the input control maps in such a manner that the input value of the battery 14 does not exceed the maximum input electric power value shown on the input control maps.

When electric power values inputted into the battery cells 16 become larger than the maximum input electric power value, input voltage values of voltage inputted into the battery cells 16 also become larger than the upper limit voltage value. When the input voltage values of voltage inputted into the battery cells 16 become larger than the upper voltage value (the value which does not include the upper voltage limit and which is larger than the upper limit voltage value; the input voltage values become the cut-off voltage), this will cause a failure of the battery cells 16.

Because of this, in the event that the electric power inputted into the battery 14 becomes larger than the maximum input electric power value (the maximum input electric power value being not included) shown on the input control maps (a value which does not include the upper limit voltage value and which is larger than the upper limit voltage value; the input voltage value becomes the cut-off voltage), the battery management unit 250 stops supplying electric power to the battery 14 (the respective battery cells 16) or controls the supply of electric power to the battery 14 in such a manner that the input electric power becomes the maximum input electric power value.

In addition, electric power is inputted into the respective battery cells 16 on such an occasion that a regenerative brake system is used or the battery cells 16 are charged with an external power supply such as, for example, a domestic power supply. The regenerative brake system includes the electric vehicle control unit 200, the motor 12, and the battery 14. The regenerative brake system is a system in which the motor 12 is made to operate as a generator by rotational forces of wheels (not shown) as when the electric vehicle 10 is braked to reduce the speed so that kinetic energy of the electric vehicle 10 is transformed into electric energy to charge the battery 14 (the respective battery cells 16).

The battery 14 (the respective battery cells 16) is affected to deteriorate by time over which the battery 14 is used and environment (such as temperature) in which it is used. As the battery 14 deteriorates, the maximum values of electric power that can actually be inputted into and outputted from the battery 14 change. Because of this, a plurality of output control maps and a plurality of input control maps are used in association with the degree of deterioration of the battery 14 (the respective battery cells 16). Namely, a plurality of output control maps and a plurality of input control maps are used for the battery 14.

In this embodiment, for example, as output control maps, three map groups such as a first output control map group 41, a second output control map group 42, and a third output control map group 43 are used. As input control maps, a first input control map 51, a second control map 52 and a third input control map 53 are used.

The first output control map group 41 is a group of output control maps for use at a first stage. The first stage is a deteriorating state of the battery 14 which lasts for a period of time from a point in time at which the battery 14 is manufactured to a point in time at which a first determination of deterioration thereof is made by the battery management unit 250. The first determination of deterioration and the first stage will be described in detail later.

The first output control map group 41 includes a plurality of maps. Specifically, in the first output control map group 41, a map is used for each of a plurality of divided temperature zones of the battery 14 in the first stage, and therefore, the plurality of maps are used. In this embodiment, as an example, the temperature of the battery 14 is divided into first to fifth states.

A first state is a state in which the temperature of the battery 14 is lower than −10 degrees (Celsius). A second state is a state in which the temperature of the battery 14 is in the range of −10 degrees to lower than 0 degree (Celsius). A third state is a state in which the temperature of the battery 14 is in the range of 0 degree to lower than 10 degrees (Celsius). A fourth state is a state in which the temperature of the battery 14 is in the range of 10 degrees to lower than 25 degrees (Celsius). A fifth state is a state in which the temperature of the battery 14 is in the range of equal to or higher than 25 degrees (Celsius).

In addition, in this embodiment, a lowest temperature in temperatures of the respective battery cells 16 which are detected by the respective battery cell monitoring parts 21 is adopted for the temperature of the battery 14. The battery management unit 250 uses an output control map which is associated with a lowest temperature in the temperatures of the battery cells 16 so detected.

Additionally, a method of determination of the temperature of the battery 14 is not limited to the method that has been described above. For example, a mean value of the temperatures of the respective battery cells 16 (which are detected by the corresponding battery cell monitoring parts 21) may be used.

Figure 3:
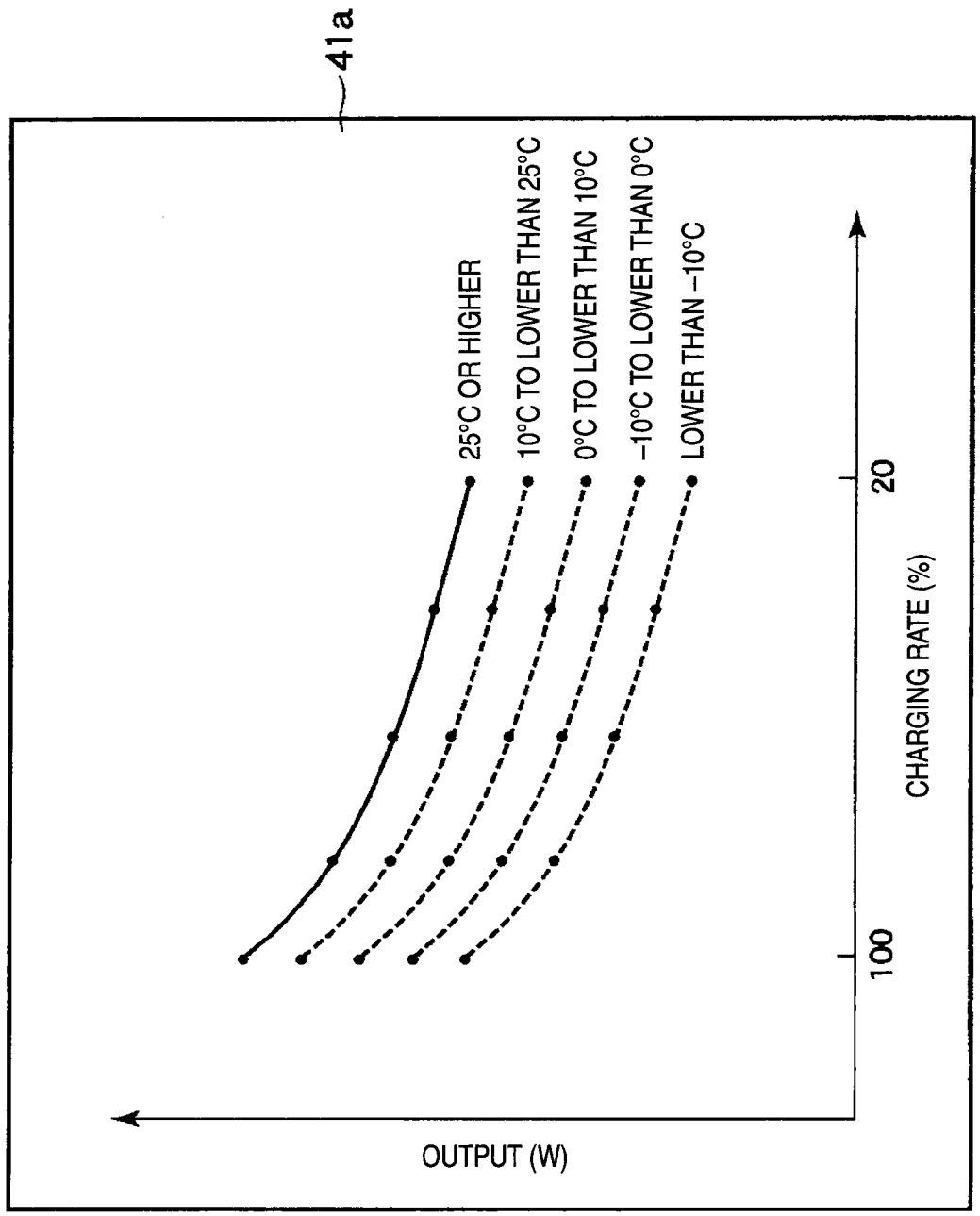
FIG. 3 is a graph showing a first output control map in a fifth state of the embodiment.
Figure 4:
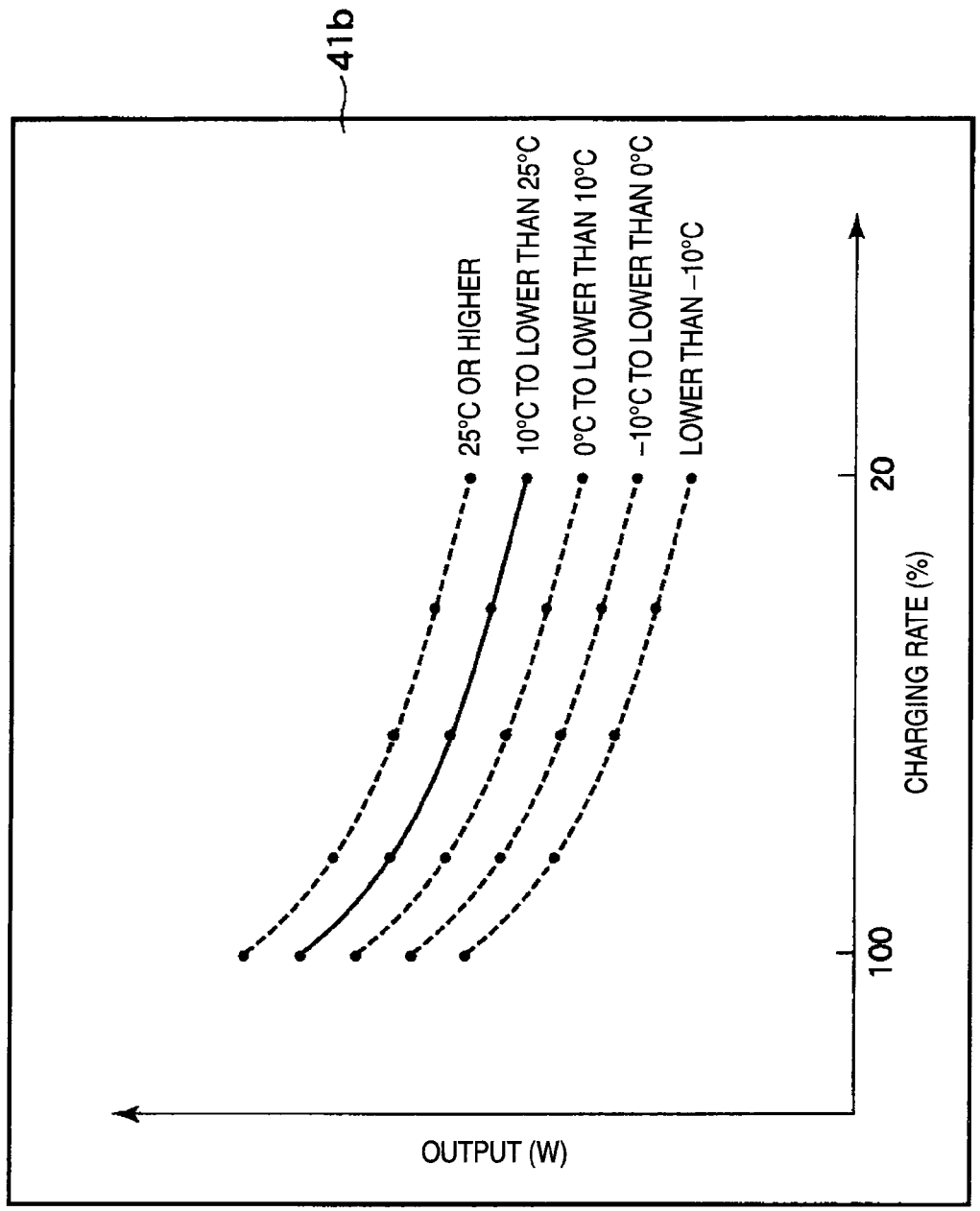
FIG. 4 is a graph showing the first output control map in a fourth state of the embodiment.
Figure 5:
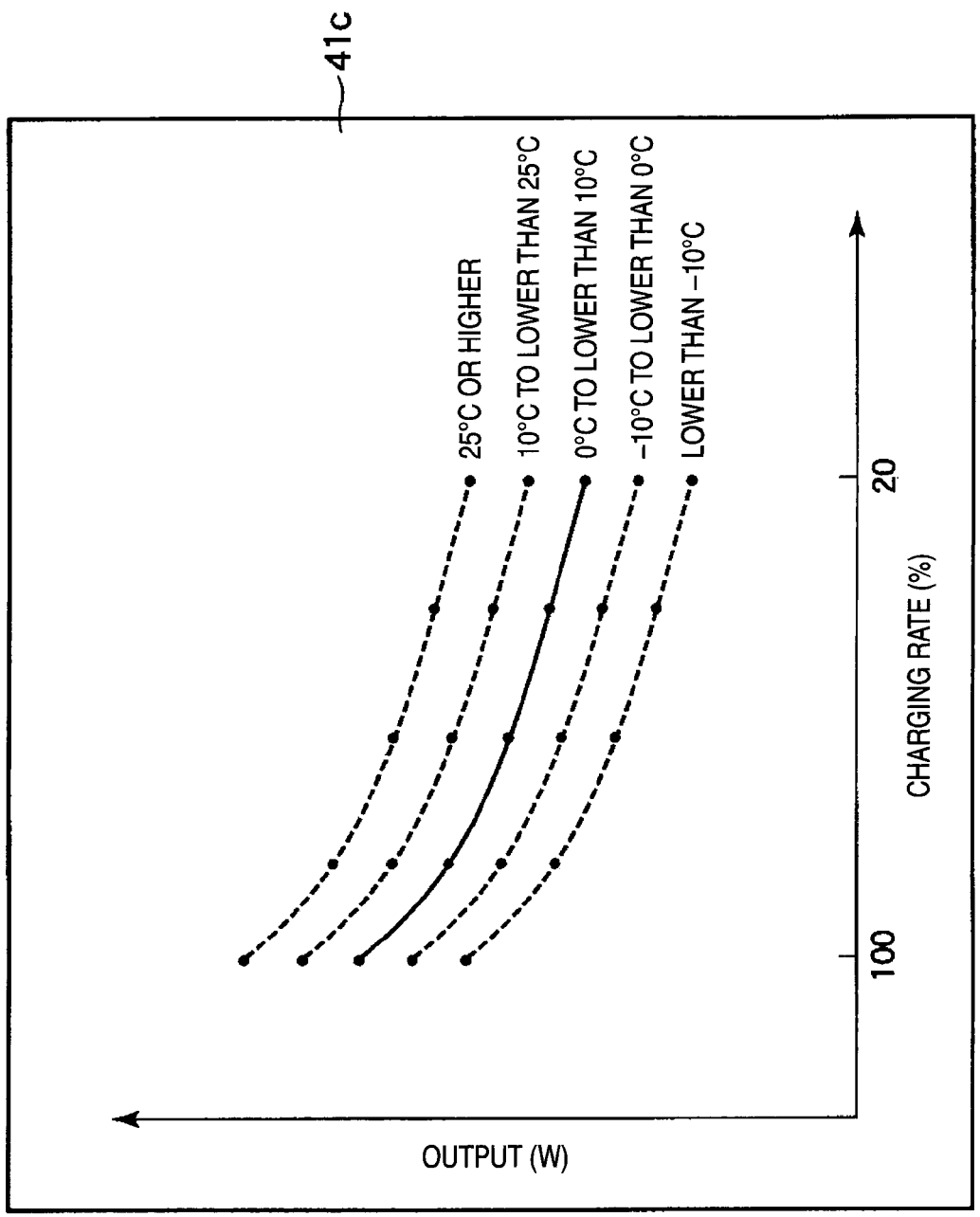
FIG. 5 is a graph showing the first output control map in a third state of the embodiment.
Figure 6:
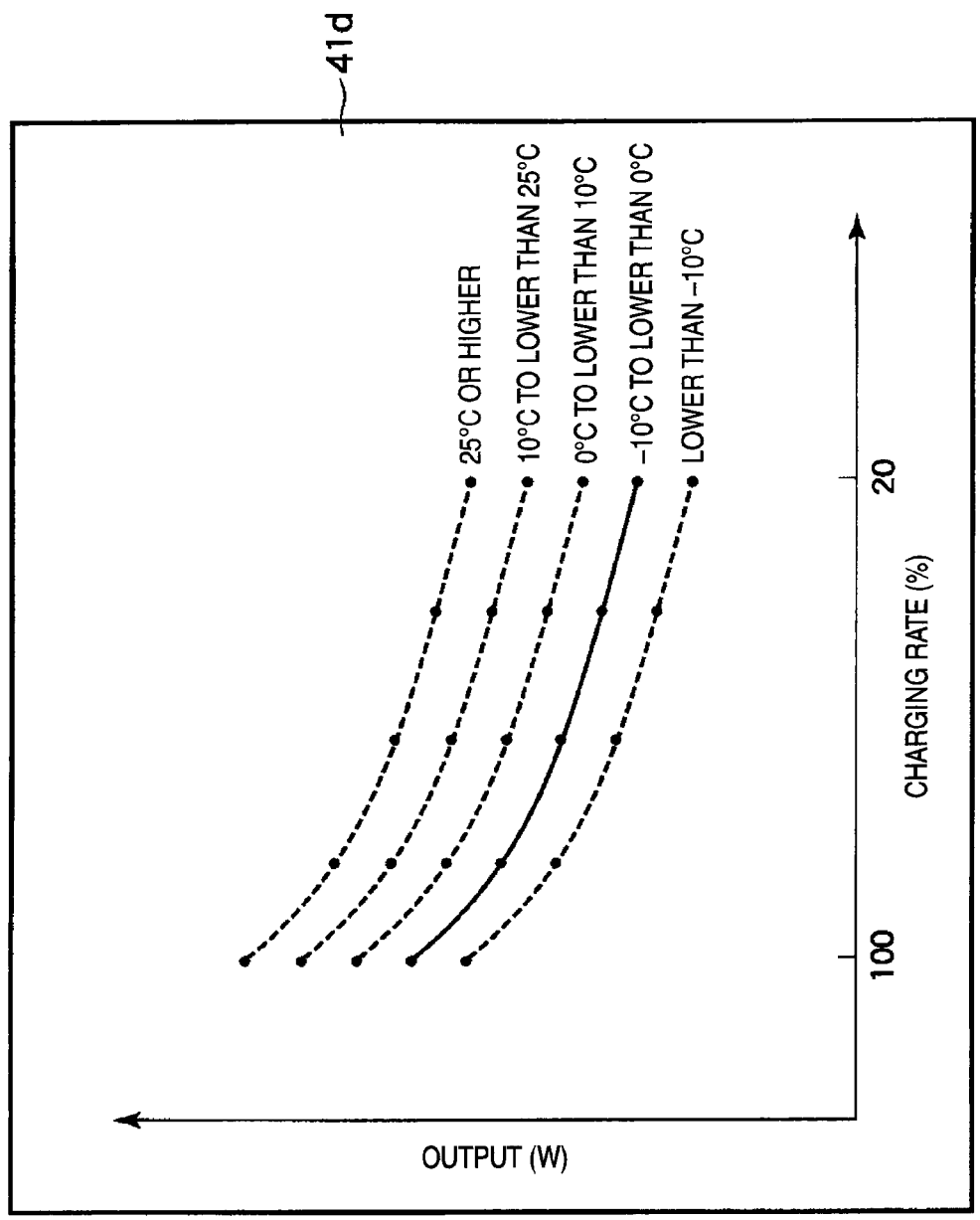
FIG. 6 is a graph showing the first output control map in a second state of the embodiment.
Figure 7:
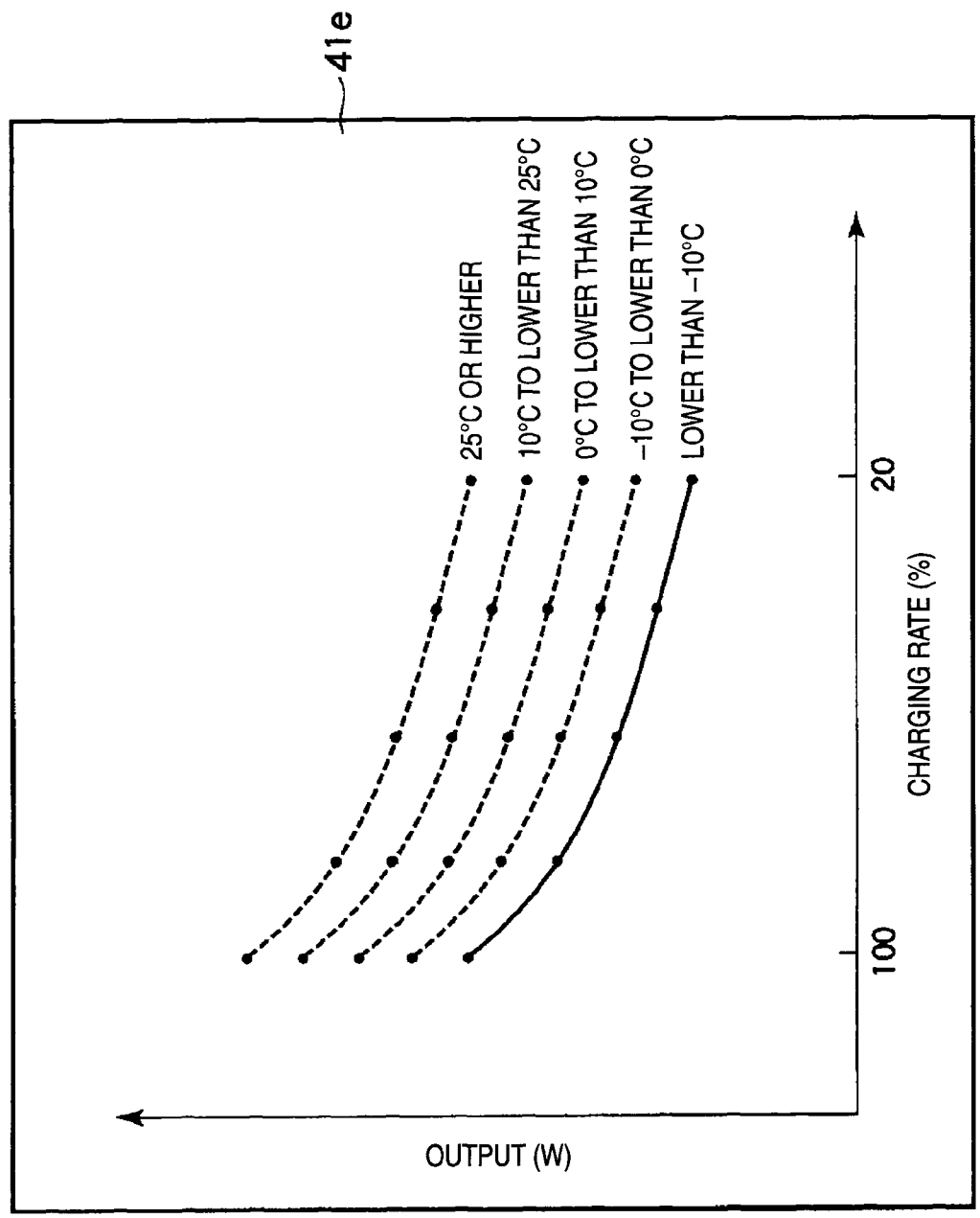
FIG. 7 is a graph showing the first output control map in a first state of the embodiment.

The first output control map group 41 includes a first output control map 41a shown in FIG. 3 which is used in the fifth state, a first output control map 41b shown in FIG. 4 which is used in the fourth state, a first output control map 41c shown in FIG. 5 which is used in the third state, a first output control map 41d shown in FIG. 6 which is used in the second state, and a first output control map 41e shown in FIG. 7 which is used in the first state.

As is shown in FIGS. 3 to 7, in the first output control maps 41a to 41e, an axis of abscissas denotes the charging rate of the battery 14. In the maps, a leftmost portion of the axis of abscissas denotes a fully charged state, and as the axis of abscissas extends rightwards, the charging rate of the battery 14 decreases. In the first output control maps 41a to 41e, an axis of ordinates denotes the output (W) of the battery 14. In the maps, the output (W) of the battery 14 increases as the axis of ordinates extends upwards.

The first output control maps 41a to 41e show maximum output electric power values that could be outputted (that is considered to be able to be outputted) by the battery 14 in the first to fifth states in such a manner as to be associated with charging rates of the battery 14 in the first to fifth states. In each map, the maximum output electric power value is indicated by a solid line in each of the first to fifth states. The first determination of deterioration of the battery 14 is to determine that the battery 14 is in such a state that the battery 14 cannot be controlled along the first output control map group 41.

In addition, as is shown in FIGS. 3 to 7, the first output control maps 41a to 41e are prepared separately. In FIGS. 3 to 7, the maximum output electric power values in the other temperature states (for example, in the case of the first output control map for the first state, the other temperature states denote temperature states of the second to fifth states) are indicated by dotted lines for comparison.

As indicated by the dotted lines, even at the first stage, the maximum output electric power value becomes larger as the temperature of the battery 14 becomes higher. On the contrary, the maximum output electric power value becomes smaller as the temperature of the battery 14 becomes lower.

Axes of abscissas and ordinates of the second output control map group 42 denote the same as what the axes of abscissas and ordinates of the first output control map group 41 (41a to 41e) denote. The second output control map group 42 is a group of output control maps for use at the second stage.

The second stage is a deteriorating state of the battery 14 which lasts for a period of time after the first determination of deterioration of the battery 14 has been made until a second determination of deterioration of the battery 14 is made by the battery management unit 250. The second output control map group 42 shows maximum output electric power values that could be outputted (that are considered to be able to be outputted) by the battery 14 at the second stage in such a manner as to be associated with charging rates of the battery 14 at the second stage. Maximum output electric power values are indicated by solid lines.

The second stage is a state in which the deteriorating state of the battery 14 is developed further than that at the first stage. The second determination of deterioration of the battery 14 is to determine that the battery 14 is in such a state that the battery 14 cannot be controlled along the second output control map 42. The second determination of deterioration and the second state will be described in detail later.

The second output control map group 42 includes a plurality of maps. Specifically, in the second output control map group 42, a map is used for each of first to fifth states, and therefore, the plurality of maps are used. The first to fifth states of the second output control map group 42 are the same as those which have been described above with respect to the first output control map group 41.

Figure 8:
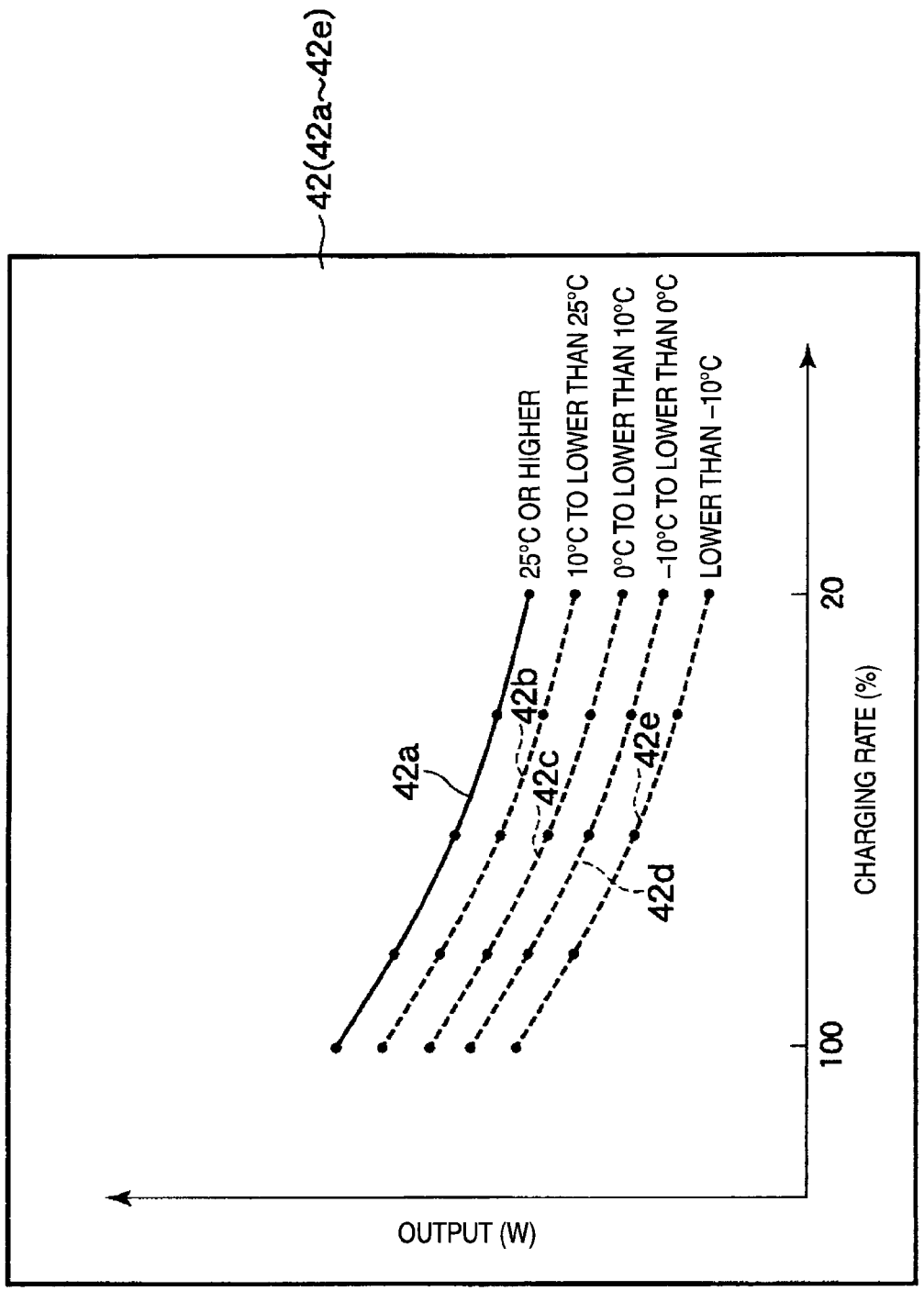
FIG. 8 is a graph showing a second output control map group of the embodiment.

FIG. 8 shows the second output control map group 42. The second output control map group 42 includes a second output control map 42a which is used in the fifth state, a second output control map 42b which is used in the fourth state shown, a second output control map 42c which is used in the third state, a second output control map 42d which is used in the second state, and a second output control map 42e which is used in the first state.

In addition, in FIG. 8, the second output control map 42e which is used in the fifth state is indicated by a solid line, and the second output control maps 42b to 42e which are used in the first to fourth states are indicated by dotted lines.

Additionally, although the second output control map group 42 (42a to 42e) is shown in FIG. 8 altogether for the sake of explanation, in reality, the maps are prepared in such a manner as to be associated with the respective states on a one-to-one basis as with the first output control map group 41 (41a to 41e). Namely, in reality, the second output control maps 42a to 42e which are used in the first to fifth states are shown one by one.

As indicated by the dotted lines, even at the second stage, the maximum output electric power value becomes larger as the temperature of the battery 14 becomes higher. On the contrary, the maximum output electric power value becomes smaller as the temperature of the battery 14 becomes lower.

Figure 9:
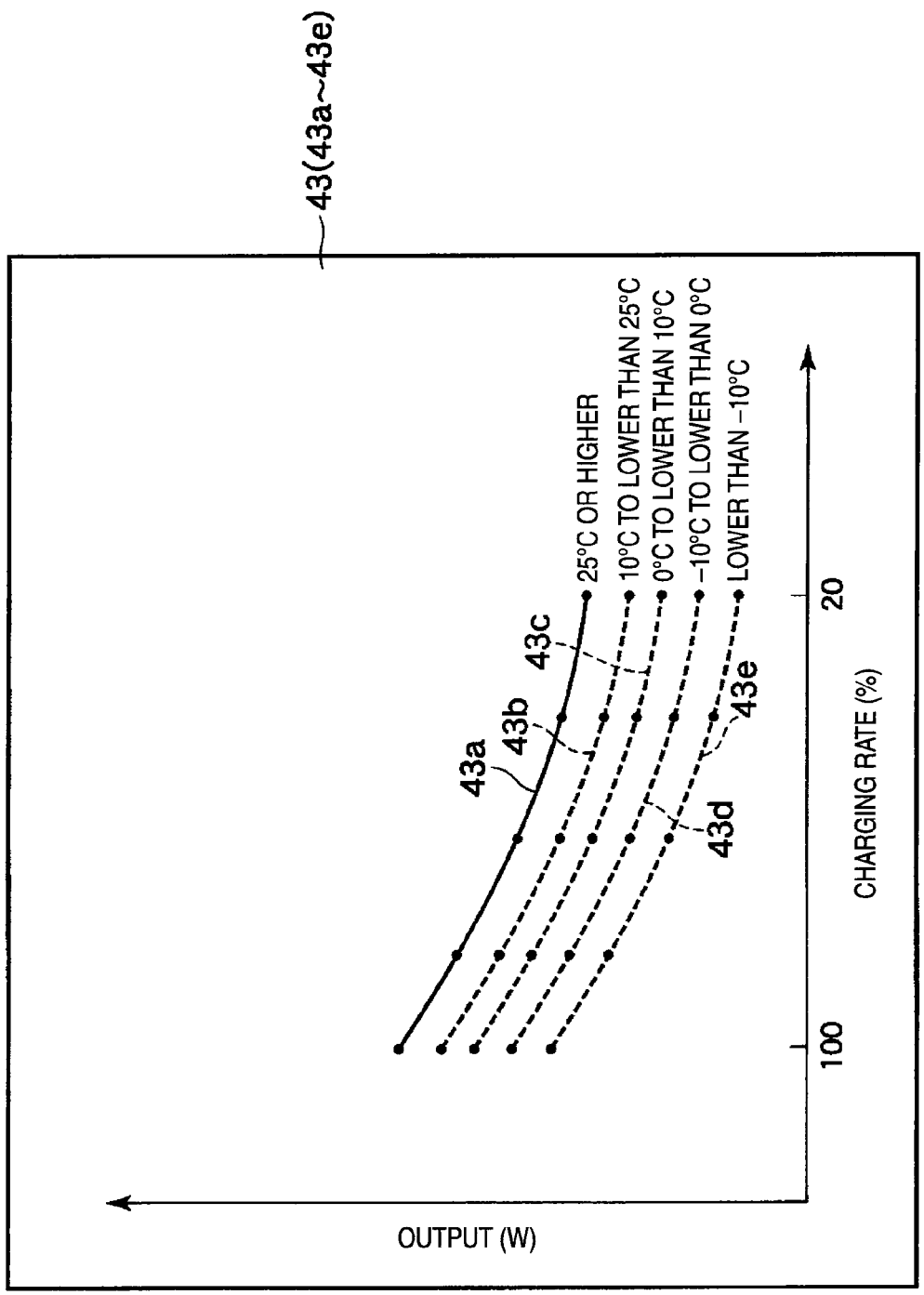
FIG. 9 is a graph showing a third output control map group of the embodiment.

FIG. 9 shows the third output control map group 43. As is shown in FIG. 9, axes of abscissas and ordinates of the third output control map group 43 denote the same as what the axes of abscissas and ordinates of the first output control map group 41 denote. The third output control map group 43 is a group of output control maps for use at the third stage. The third stage is a deteriorating state of the battery 14 which lasts for a period of time after the second determination of deterioration of the battery 14 until a third determination of deterioration of the battery 14 is made by the battery management unit 250. The third output control map group 43 shows maximum output electric power values which are associated with charging rates of the battery 14 at the third stage.

The third stage is a state in which the deteriorating state of the battery 14 is developed further than that at the second stage. The third determination of deterioration of the battery 14 is to determine that the battery 14 is in such a state that the battery 14 cannot be controlled along the third output control map 43. The third determination of deterioration and the third state will be described in detail later.

The third output control map group 43 includes a plurality of maps. Specifically, in the third output control map group 43, a map is used for each of first to fifth states, and therefore, the plurality of maps are used. The first to fifth states of the third output control map group 43 are the same as those which have been described above with respect to the first output control map group.

FIG. 9 shows the third output control map group 43. The third output control map group 43 includes a third output control map 43*a* which is used in the fifth state, a third output control map 43*b* which is used in the fourth state shown, a third output control map 43*c* which is used in the third state, a third output control map 43*d* which is used in the second state, and a third output control map 43*e* which is used in the first state.

In addition, in FIG. 9, the third output control map 43*a* which is used in the fifth state is indicated by a solid line, and the third output control maps 43*b* to 43*e* which are used in the first to fourth states are indicated by dotted lines.

Additionally, although the third output control map group 43 (43*a* to 43*e*) is shown in FIG. 9 altogether for the sake of explanation, in reality, the maps are prepared in such a manner as to be associated with the respective states on a one-to-one basis as with the first output control map group 41 (41*a* to 41*e*). Namely, in reality, the third output control maps 43*a* to 43*e* which are used in the first to fifth states are shown one by one.

As indicated by the dotted lines, even at the third stage, the maximum output electric power value becomes larger as the temperature of the battery 14 becomes higher. On the contrary, the maximum output electric power value becomes smaller as the temperature of the battery 14 becomes lower.

Figure 10:
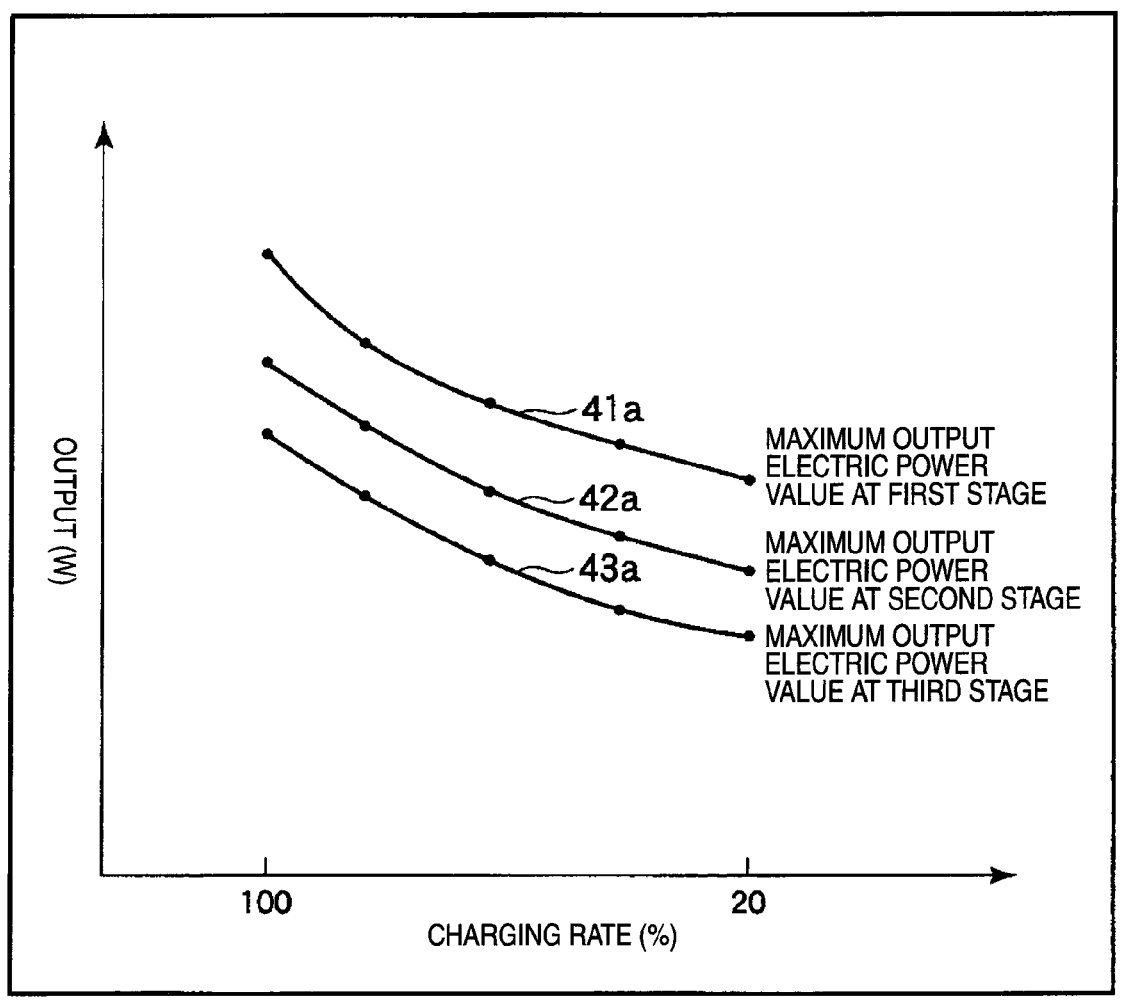
FIG. 10 is a graph showing a state in which the first to third output control map groups of the embodiment are compared.

FIG. 10 shows a comparison among the first to third output control maps. Maximum output electric power values shown on the maps of the respective states (the first to fifth states) of the battery 14 which is at the first stage are larger than maximum output electric power values shown on the maps of the corresponding states of the battery 14 which is at the second stage.

Specifically, a maximum output electric power value shown on the map of the first state of the battery 14 which is at the first stage is larger than a maximum output electric power value shown on the map of the first state of the battery 14 which is at the second stage. This will be true with maximum output electric power values of the second to fifth states.

In addition, similarly, maximum output electric power values shown on the maps of the respective states (the first to fifth states) of the battery 14 which is at the second stage are larger than maximum output electric power values shown on the maps of the corresponding states of the battery 14 which is at the third stage.

FIG. 10 shows the result of a comparison of maximum output electric power values in the first state of the battery 14 when it is at the first to third stages. FIG. 10 shows only an example, and as has been described above, the same relationship as that shown in FIG. 10 will result in the other states. It should be noted that FIG. 10 is a graph used to explain what has been described above.

As is seen from what has been described above, the first to third output control map groups 41 to 43 are used sequentially at the corresponding first to third stages in accordance with the degree of development of the deteriorating state of the battery cells 16. In addition, at each stage, the maps are used in such a manner as to match the temperature of the battery 14. As is shown in FIGS. 3 to 10, the battery 14 has a tendency in which the maximum output electric power values shown on the maps decrease as the charging rate of the battery 14 decreases.

Figure 11:
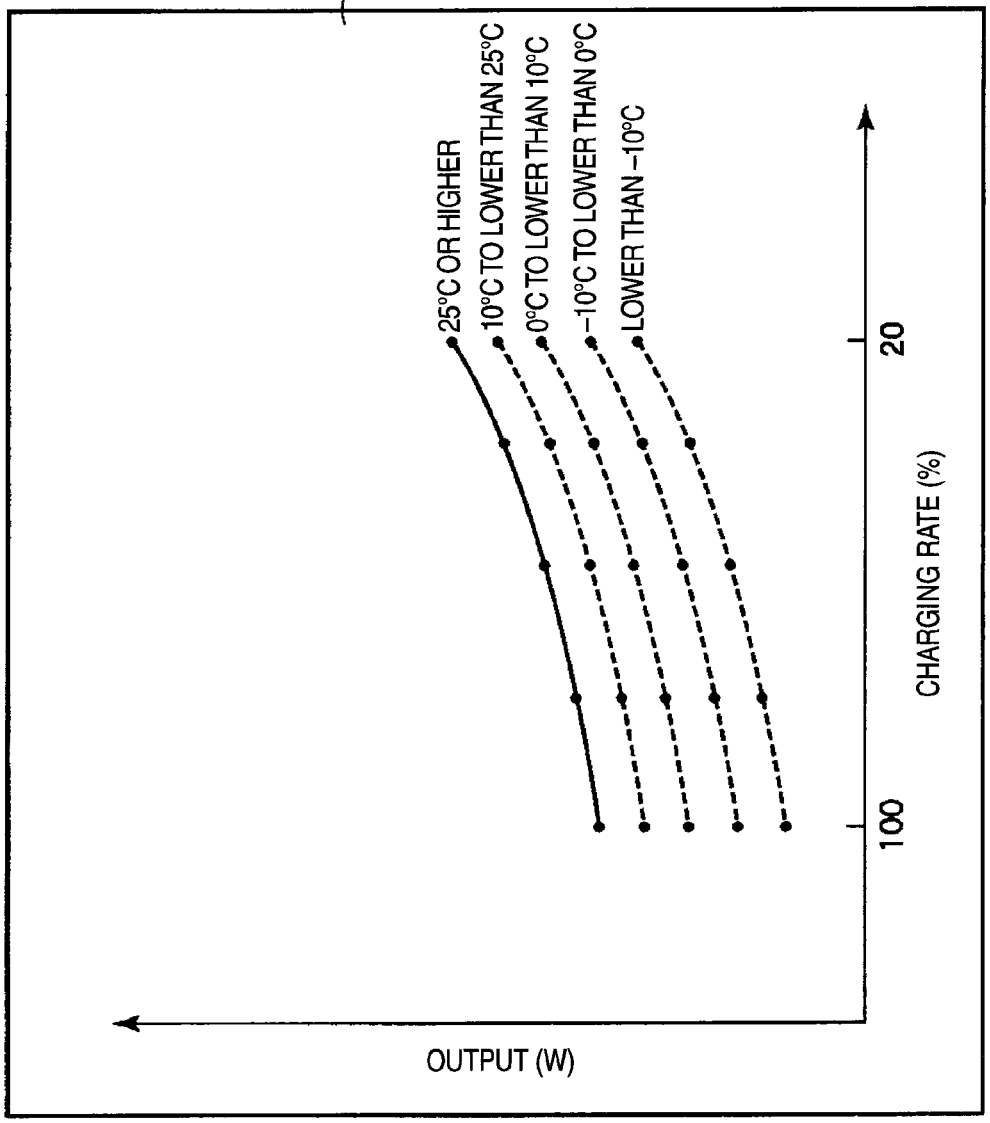
FIG. 11 is a graph showing a first input control map in a fifth state of the embodiment.
Figure 12:
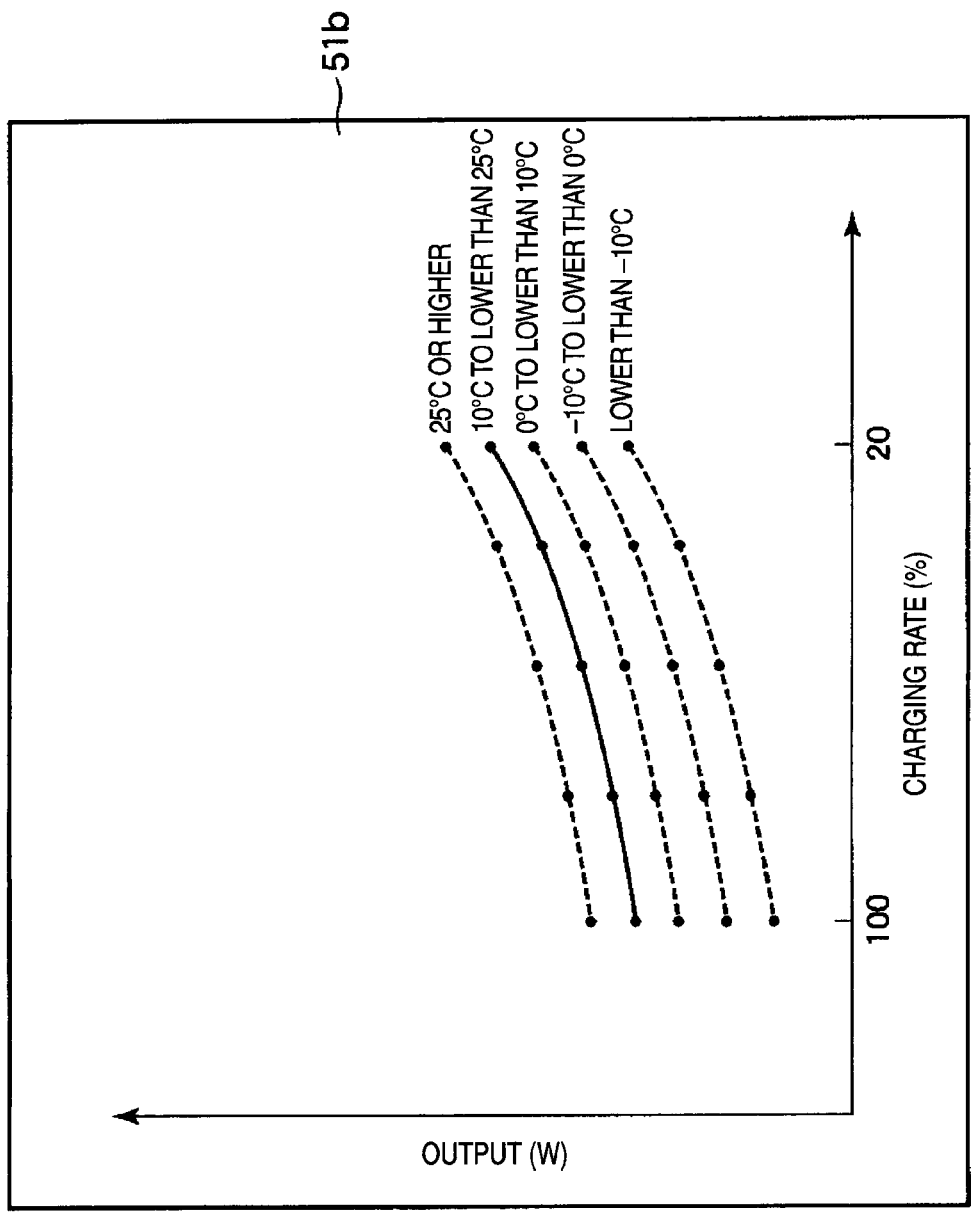
FIG. 12 is a graph showing the first input control map in a fourth state of the embodiment.
Figure 13:
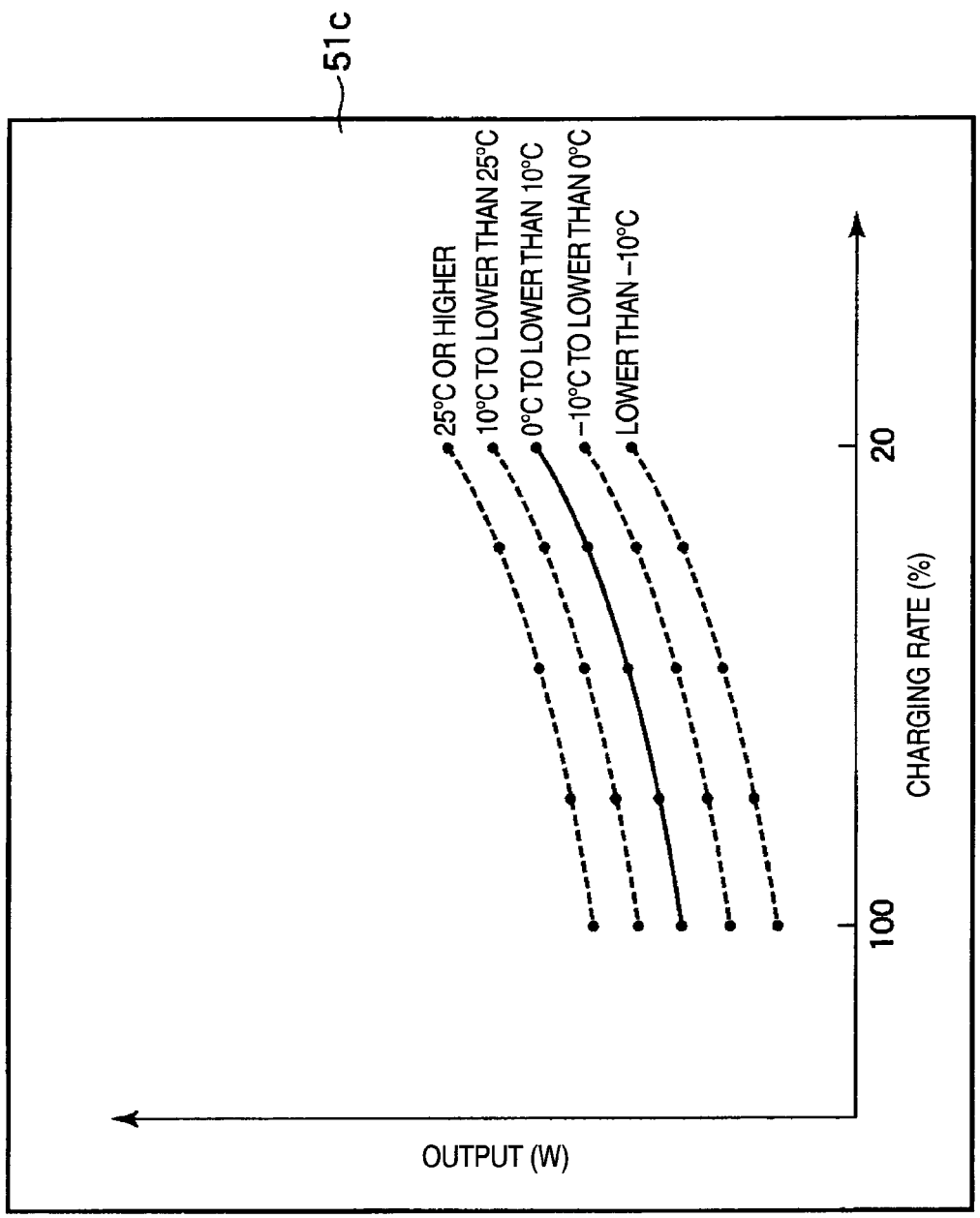
FIG. 13 is a graph showing the first input control map in a third state of the embodiment.
Figure 14:
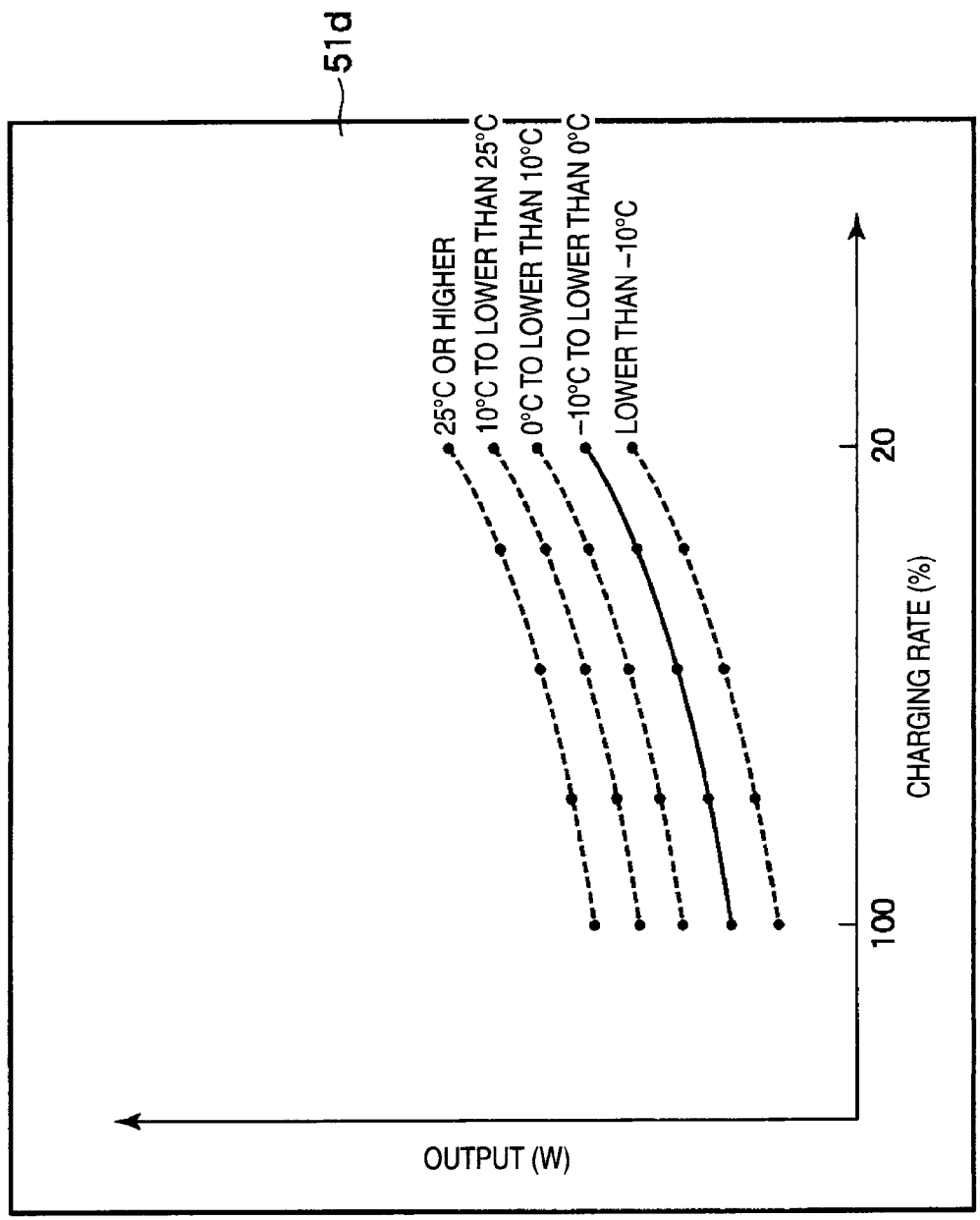
FIG. 14 is a graph showing the first input control map in a second state of the embodiment.
Figure 15:
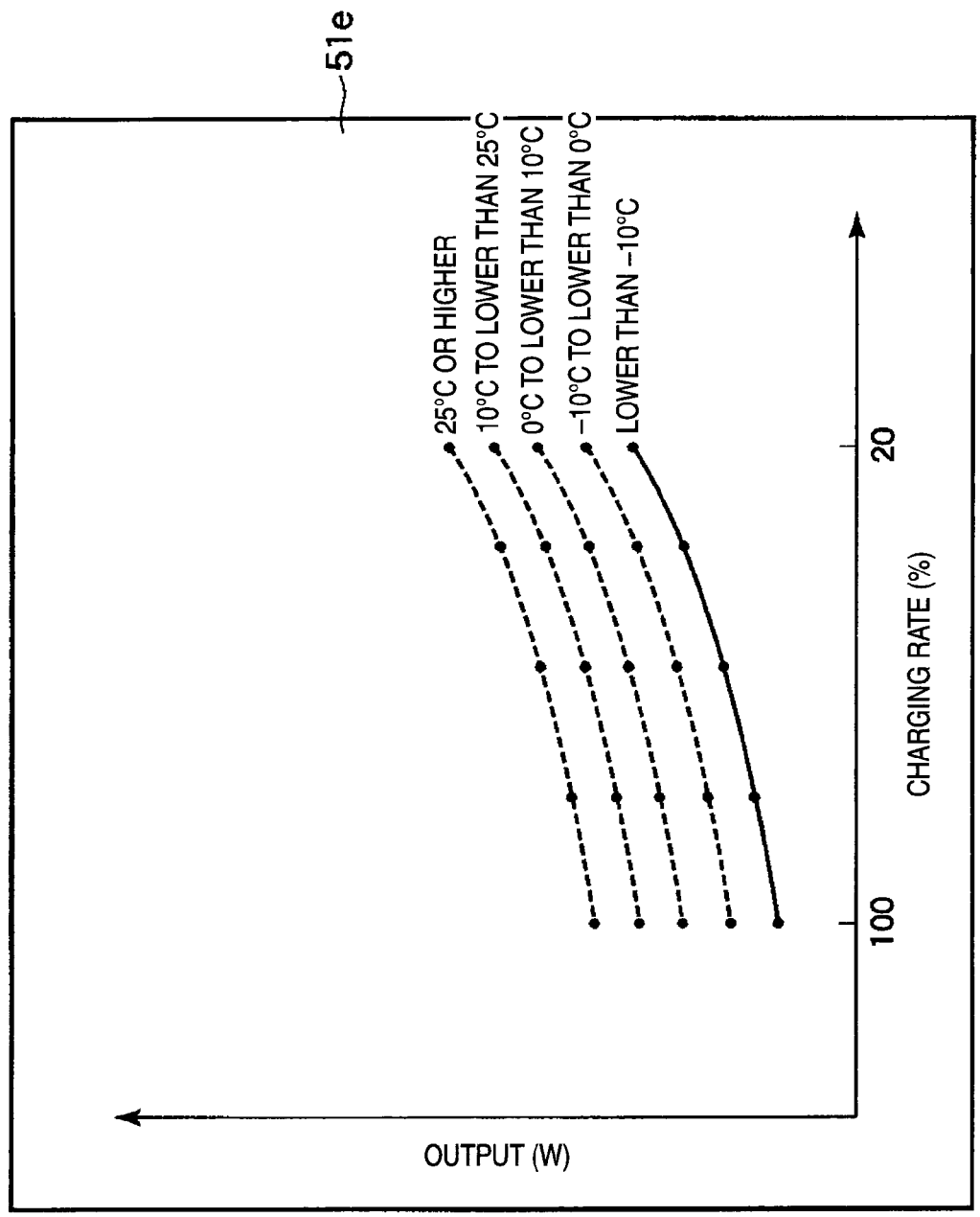
FIG. 15 is a graph showing the first input control map in a first state of the embodiment.

The first input control map group 51 is a group of input control maps which is used at the first stage. The first input control map group 51 includes a first input control map 51*a* shown in FIG. 11 which is used in the fifth state, a first input control map 51*b* shown in FIG. 12 which is used in the fourth state, a first input control map 51*c* shown in FIG. 13 which is used in the third state shown, a first input control map 51*d* shown in FIG. 14 which is used in the second state, and a first input control map 51*e* shown in FIG. 15 which is used in the first state.

As is shown in FIGS. 11 to 15, in the first input control map group 51, an axis of abscissas denotes the charging rate of the battery 14. In the maps, a leftmost portion of the axis of abscissas denotes a fully charged state, and as the axis of abscissas extends rightwards, the charging rate of the battery 14 decreases. In the first input control map group 51, an axis of ordinates denotes an input value (W) of the battery 14. In the maps, the input value (W) of the battery 14 increases as the axis of ordinates extends upwards. The first input control map group 51 shows maximum input electric power values that could be inputted (that is considered to be able to be inputted) into the battery 14 in the first to fifth states in such a manner as to be associated with charging rates of the battery 14 at the first stage in the first to fifth states. In FIGS. 11 to 15, the maximum input electric power values in the associated temperature zones (for example, the fifth state in FIG. 11, and the fourth state in FIG. 12) are indicated by solid lines. In addition, in FIGS. 11 to 15, the maximum input electric power values in the other states than the state which is to be shown in the specific figure in FIGS. 11 to 15 are indicated by dotted lines.

As indicated by the dotted lines, even at the first stage, the maximum input electric value becomes larger as the temperature of the battery 14 becomes higher. On the contrary, the maximum input electric power value becomes smaller as the temperature of the battery 14 becomes lower.

Figure 16:
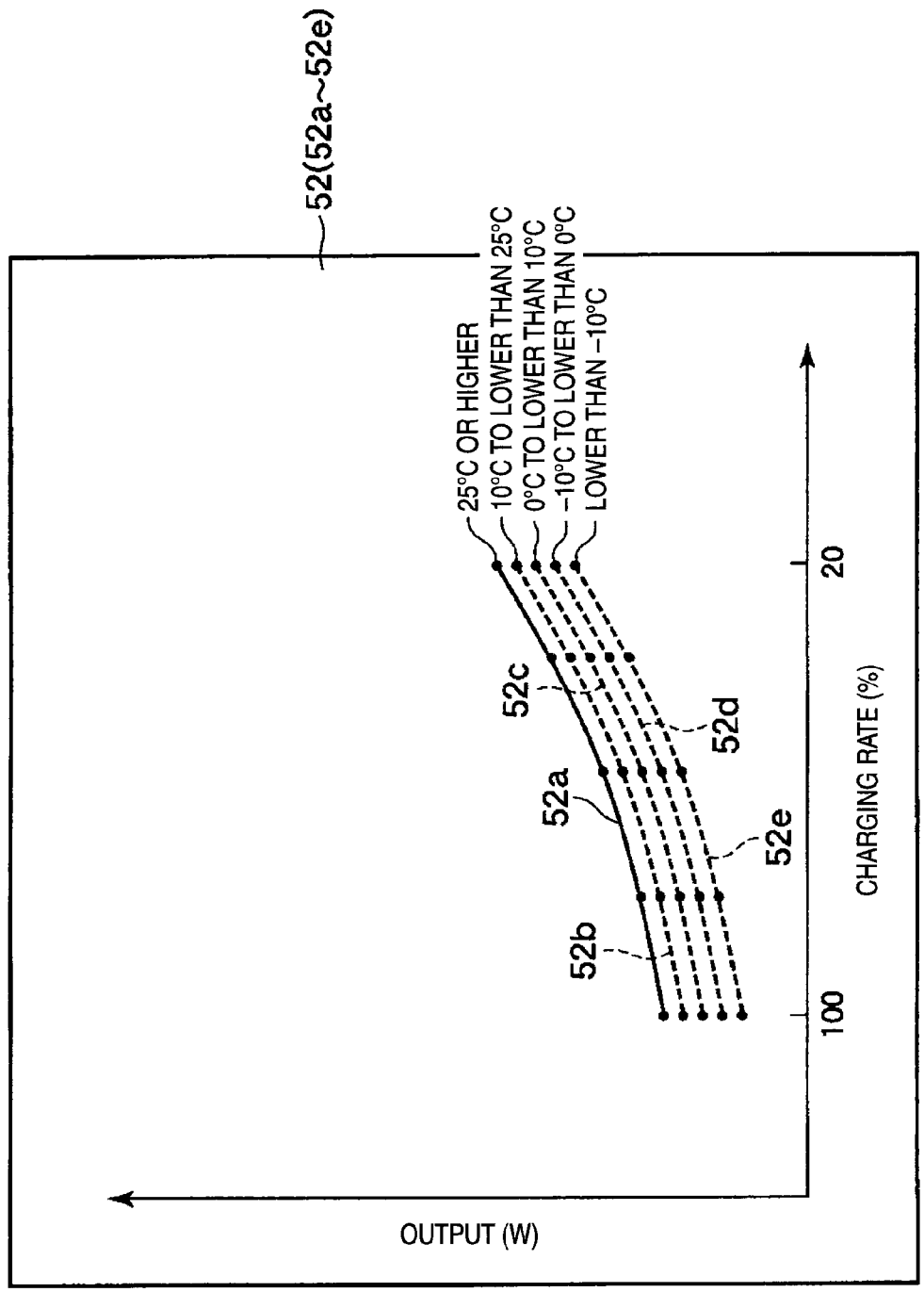
FIG. 16 is a graph showing a second input control map group of the embodiment.

FIG. 16 shows the second input control map group 52. Axes of abscissas and ordinates of the second input control map group 52 are similar to those of the first input control map group 51. As is shown in FIG. 16, the second input control map group 52 is a group of input control maps which is used at the second stage. The second input control map group 52 shows maximum input electric power values that could be inputted (that is considered to be able to be inputted) into the battery 14 in the first to fifth states in such a manner as to be associated with charging rates of the battery 14 at the second stage in the first to fifth states.

The second input control map group 52 includes a plurality of maps. Specifically, in the second input control map group 52, a map is used for each of first to fifth states, and therefore, the plurality of maps are used. The first to fifth states of the second input control map group 52 are the same as those which have been described above with respect to the first input control map group 51.

FIG. 16 shows the second input control map group 52. The second input control map group 52 includes a second input control map 52a which is used in the fifth state, a second input control map 52b which is used in the fourth state, a second input control map 52c which is used in the third state, a second input control map 52d which is used in the second state, and a second input control map 52e which is used in the first state.

In FIG. 16, the second input control map 52a which is used in the fifth state is indicated by a solid line, and the second input control maps 52b to 52e which are used in the first to fourth states are indicated by dotted lines.

Additionally, although the second input control map group 52 (52a to 52e) is shown in FIG. 16 altogether for the sake of explanation, in reality, the maps are prepared in such a manner as to be associated with the respective states on a one-to-one basis as with the first input control map group 51 (51a to 51e). Namely, in reality, the second input control maps 52a to 52e which are used in the first to fifth states are shown one by one.

As indicated by the dotted lines, even at the second stage, the maximum output electric power value becomes larger as the temperature of the battery 14 becomes higher. On the contrary, the maximum output electric power value becomes smaller as the temperature of the battery 14 becomes lower.

Figure 17:
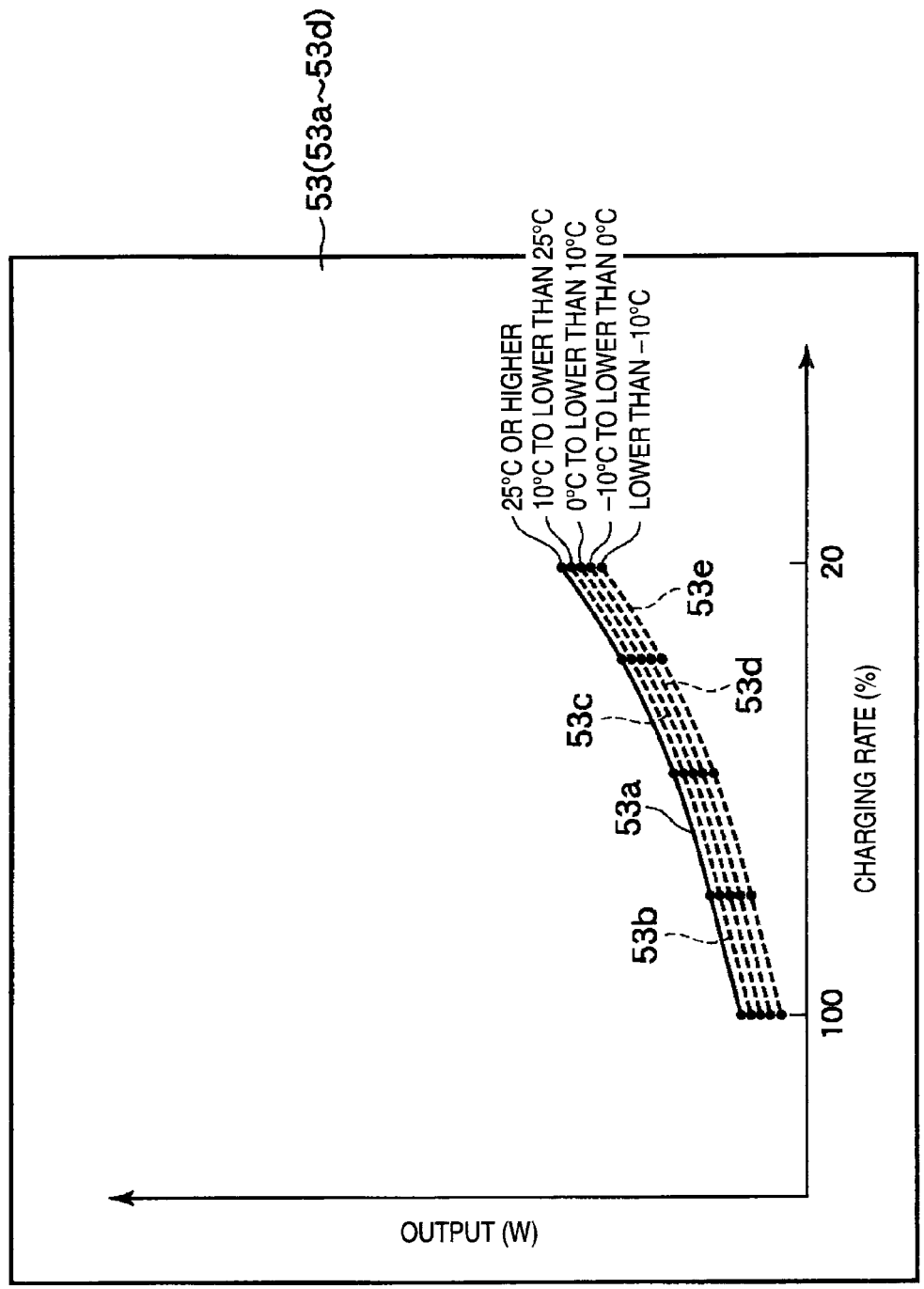
FIG. 17 is a graph showing a third input control map group of the embodiment.

FIG. 17 shows the third input control map group 53. Axes of abscissas and ordinates of the third input control map group 53 denote the same as what the axes of abscissas and ordinates of the first input control map group 51 denote. As is shown in FIG. 17, the third input control map group 53 is a group of input control maps for use at the third stage. The third input control map group 53 shows maximum input electric power values that could be inputted (that is considered to be able to be inputted) into the battery 14 in the first to fifth states in such a manner as to be associated with charging rates of the battery 14 at the third stage in the first to fifth states.

The third input control map group 53 includes a plurality of maps. Specifically, in the third input control map group 53, a map is used for each of first to fifth states, and therefore, the plurality of maps are used. The first to fifth states of the third input control map group 53 are the same as those which have been described above with respect to the first input control map group 51.

FIG. 17 shows the third input control map group 53. The third input control map group 53 includes a third input control map 53a which is used in the fifth state, a third input control map 53b which is used in the fourth state, a third input control map 53c which is used in the third state, a third input control map 53d which is used in the second state, and a third input control map 53e which is used in the first state.

In addition, in FIG. 17, the third input control map 52a which is used in the fifth state is indicated by a solid line, and the second input control maps 52b to 52e which are used in the first to fourth states are indicated by dotted lines.

Additionally, although the third input control map group 53 (53a to 53e) is shown in FIG. 17 altogether for the sake of explanation, in reality, the maps are prepared in such a manner as to be associated with the respective states on a one-to-one basis as with the first input control map group 51 (51a to 51e). Namely, in reality, the third input control maps 53a to 53e which are used in the first to fifth states are shown one by one.

As indicated by the dotted lines, even at the third stage, the maximum input electric power value becomes larger as the temperature of the battery 14 becomes higher. On the contrary, the maximum input electric power value becomes smaller as the temperature of the battery 14 becomes lower.

Figure 18:
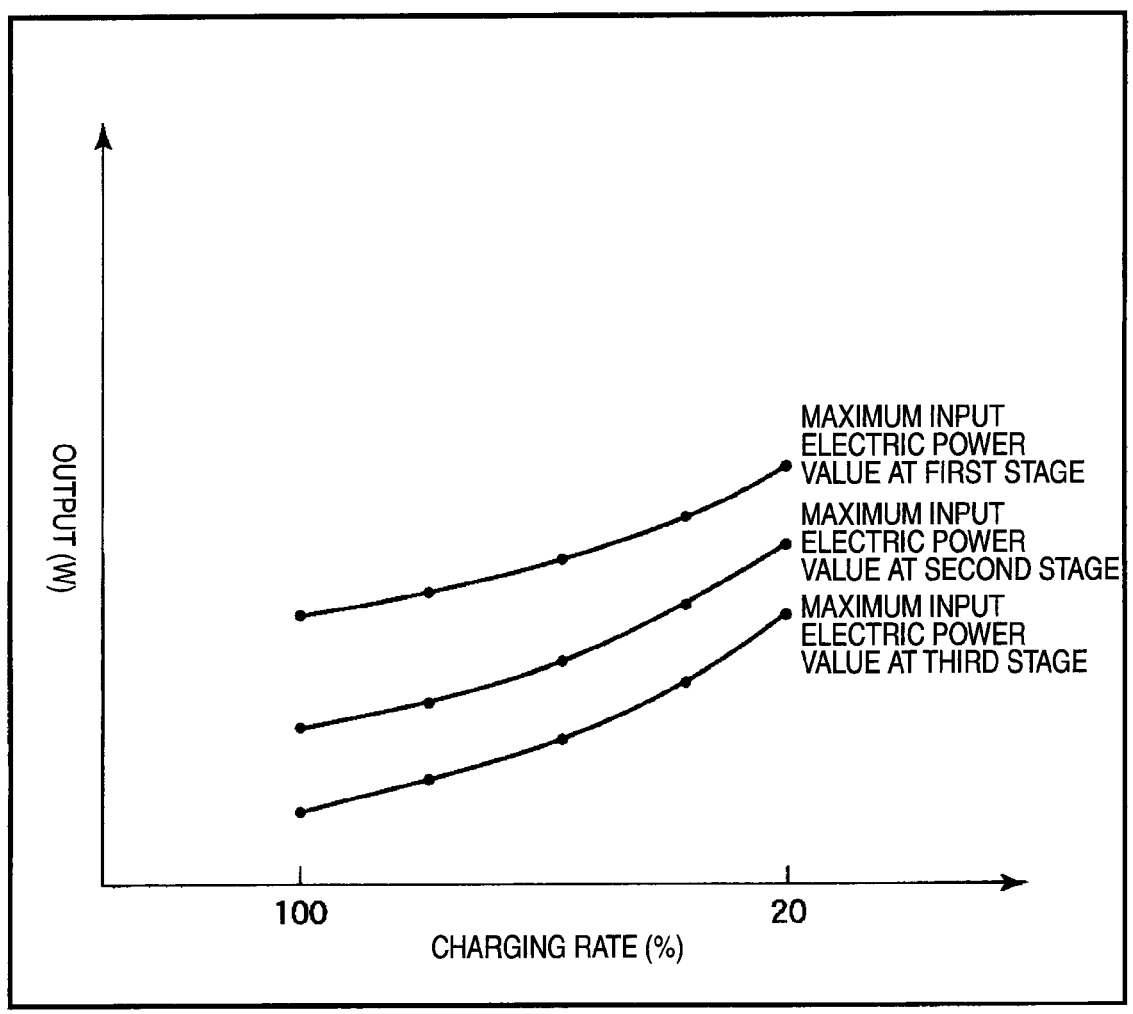
FIG. 18 is a graph showing a state in which the first to third input control map groups of the embodiment are compared.

FIG. 18 shows a comparison among maximum input electric power values of the first to third input control map groups in the first state. Maximum input electric power values shown on the maps of the respective states (the first to fifth states) of the battery 14 which is at the first stage are larger than maximum input electric power values shown on the maps of the corresponding states of the battery 14 which is at the second stage.

Specifically, in FIG. 18, a maximum input electric power value shown on the map of the first state of the battery 14 which is at the first stage is larger than a maximum input electric power value shown on the map of the first state of the battery 14 which is at the second stage. This will be true with maximum input electric power values of the second to fifth states.

In addition, similarly, maximum input electric power values shown on the maps of the respective states (the first to fifth states) of the battery 14 which is at the second stage are larger than maximum output electric power values shown on the maps of the corresponding states of the battery 14 which is at the third stage.

FIG. 18 shows the example in the first state, and the same relationship as that shown in FIG. 18 will result in the other states. It should be noted that FIG. 18 is a graph used to explain what has been described above.

As is shown in the first to third input control map groups 51 to 53, the battery 14 has a tendency in which the maximum input amount of electric power decrease as the deteriorating state of the battery 14 is developed further. In addition, as is shown in FIGS. 11 to 18, the battery 14 has a tendency in which the maximum input electric power value increases as the charging rate of the battery 14 decreases.

As has been described heretofore, the electric vehicle control unit 200 calculates a total value of electric energy that is required by the electronic equipment installed in the electric vehicle 10 and requests an electric power value that is determined as being able to be outputted from the battery 14 as a requested electric power value from the battery management unit 250 based on the first to third output control map groups 41 to 43 in order to satisfy the calculated total value of electric energy.

In the event that the total value of electric energy so calculated is large and a larger value than the maximum output value of the battery 14 written on the output control map is necessary, the electric vehicle control unit 200 requests the battery management unit 250 to cause the battery 14 to output the maximum output electric power value written on the map.

Similarly, the electric vehicle control unit 200 calculates an electric power value that is generated by the motor 12 by the use of the regenerative brake system and/or detects an electric power value that is inputted from an external power supply and requests the battery management unit 250 to input an electric power value that is determined as being able to be inputted into the battery 14 (with which the battery 14 is charged) into the battery 14 based on the first to third input control map groups 51 to 53.

In the event that the electric power value that is generated by the motor 12 is large or the input electric power value that is inputted from the external power supply is large and the electric power value or the input electric power value is larger than the maximum input electric power value written on the map, the electric vehicle control unit 200 requests the battery management unit 250 to input the maximum input electric value written on the map into the battery 14.

Next, the first to third deterioration determinations and the first to third stages will be described. As has been described above, the deteriorating state of the battery 14 (the respective battery cells 16) is divided into the first to third stages depending upon the degree of development of the deteriorating state.

The first stage is a deteriorating state of the battery 14 which lasts for a period of time until a point in time at which a first determination of deterioration thereof is made by the battery management unit 250. In a state resulting before an electric power value that is outputted from the battery 14 (and which is detected by the battery management unit 250) reaches the maximum output electric value which is shown in the first output control map group 41, in the event that at least one of output voltage values of the plurality of battery cells 16 which are detected by the battery cell monitoring parts 21 becomes smaller than the lower limit voltage value once (in other words, in the event that at least one of output voltage values of the plurality of battery cells 16 reaches the out-off voltage once), the battery management unit 250 determines that the battery 14 has deteriorated to such an extent that the battery 14 cannot be controlled by the first output control map group 41 and then carries out the first determination of deterioration.

In other words, the first determination of deterioration is a determination that is to be carried out when there is produced a difference between the performance (the maximum output electric power value) of the battery 14 shown in the first output control map group 41 and the actual performance (the maximum output electric power value) of the battery 14.

When the first determination of deterioration is made during which the battery 14 is outputting electric power, the first output control map group 41 is replaced by the second output control map group 42, and the first input control map group 51 is replaced by the second input control map group 52.

While in this embodiment, in the state resulting before the electric power value that is actually outputted from the battery 14 reaches the maximum output electric value which is shown in the output control map, when even one of output voltage values of the plurality of battery cells 16 becomes smaller than the lower limit voltage value once (when even one of output voltage values of the plurality of battery cells 16 reaches the cut-off voltage once), the first determination of deterioration is carried out, the invention is not limited thereto. In addition, in this embodiment, "once" constitutes the "predetermined number of times" which is referred to in the invention. However, the first determination of deterioration may be made to be carried out when even any one of output voltage values of the plurality of battery cells 16 lowers below the lower limit voltage value not once but, for example, a plurality of times such as twice or three times (when even any one of output voltage values of the plurality of battery cells 16 reaches the cut-off voltage value a plurality of times). As this occurs, the "plurality of times" constitutes the "predetermined number of times" which is referred to in the invention. The predetermined number of times is preset.

In addition, in consideration of detection errors, "several times (once or a plurality of times)" may be added to the "predetermined number of times" so that the first determination of deterioration occurs when any of output voltages of the plurality of battery cells 16 lowers below the lower limit voltage value such a number of times. It is considered that a voltage value which is lower than the lower limit voltage value may be detected erroneously (a detection error), and hence, the addition of "several times" is done to suppress the occurrence of a stage change due to such a detection error (the resulting number of times denoting the "predetermined number or more of times" which is referred to in the invention).

The second stage is a deteriorating state of the battery 14 which lasts for a period of time after the first determination of deterioration has been made until a second determination of deterioration is made. In a state resulting before an electric power value that is outputted from the battery 14 (and which is detected by the battery management unit 250) reaches the maximum output electric value which is shown in the second output control map group 42, in the event that at least one of output voltage values of the plurality of battery cells 16 which are detected by the battery cell monitoring parts 21 becomes smaller than the lower limit voltage value once (in the event that at least one of output voltage values of the plurality of battery cells 16 reaches the cut-off voltage once), the battery management unit 250 determines that the battery 14 has deteriorated to such an extent that the battery 14 cannot be controlled by the second output control map group 42 and then carries out the second determination of deterioration.

In other words, the second determination of deterioration is a determination that is to be carried out when there is produced a difference between the performance (the maximum output electric power value) of the battery 14 shown in the second output control map group 42 and the actual performance (the maximum output electric power value) of the battery 14.

When the second determination of deterioration is made during which the battery 14 is outputting electric power, the second output control map group 42 is replaced by the third output control map group 43, and the second input control map group 52 is replaced by the third input control map group 53.

In addition, while in this embodiment, in the state resulting before the electric power value that is actually outputted from the battery 14 reaches the maximum output electric value which is shown in the output control map, when even one of output voltage values of the plurality of battery cells 16 becomes smaller than the lower limit voltage value once, the second determination of deterioration is carried out, the invention is not limited thereto. The second determination of deterioration may be made to be carried out when even any one of output voltage values of the plurality of battery cells 16 lowers below the lower limit voltage value not once but, for example, a plurality of times such as twice or three times. As this occurs, the "plurality of times" constitutes the "predetermined number of times." The predetermined number of times is preset. Alternatively, as has been described above, the number of times of any one of output voltage values of the plurality of battery cells 16 lowering below the lower limit voltage value may be made to be the predetermined number or more of times in consideration of detection errors.

The third stage is a deteriorating state of the battery 14 which lasts for a period of time after the second determination of deterioration has been made until a third determination of deterioration is made by the battery management unit 250. In a state resulting before an electric power value that is outputted from the battery 14 reaches the maximum output electric value which is shown in the third output control map group 43, in the event that at least one of output voltage values of the plurality of battery cells 16 which are detected by the battery cell monitoring parts 21 becomes smaller than the lower limit voltage value once (in the event that at least one of output voltage values of the plurality of battery cells 16 reaches the cut-off voltage once), the battery management unit 250 determines that the battery 14 has deteriorated to such an extent that the battery 14 cannot be controlled by the third output control map group 43 and then carries out the third determination of deterioration.

In other words, the third determination of deterioration is a determination that is to be carried out when there is produced a difference between the performance (the maximum output electric power value) of the battery 14 shown in the third output control map group 43 and the actual performance (the maximum output electric power value) of the battery 14.

When the third determination of deterioration is made during which the battery 14 is outputting electric power, the battery management unit 250 activates, for example, an indicator 60 which is provided in a position where the indicator 60 easily becomes visible from the driver so as to urge the driver to replace the battery 14 with a new one.

After the third determination of deterioration has been made, a fourth stage will result. At the fourth stage, the third output control map group 43 is used as output control maps. The third input control map group 53 is used as input control maps.

In addition, while in this embodiment, in the state resulting before the electric power value that is actually outputted from the battery 14 reaches the maximum output electric value which is shown in the output control map, when even one of output voltage values of the plurality of battery cells 16 becomes smaller than the lower limit voltage value once, the third determination of deterioration is carried out, the invention is not limited thereto. The third determination of deterioration may be made to be carried out when even any one of output voltage values of the plurality of battery cells 16 lowers below the lower limit voltage value not once but, for example, a plurality of times such as twice or three times. As this occurs, the "plurality of times" constitutes the "predetermined number of times." The predetermined number of times is preset. Alternatively, as has been described above, the number of times of any one of output voltage values of the plurality of battery cells 16 lowering below the lower limit voltage value may be made to be the predetermined number or more of times in consideration of detection errors. As the means for urging the driver to replace the battery 14 with a new one, the invention is not limited to the indicator. For example, sound or artificial voice may be used to urge the replacement of batteries.

Figure 19:
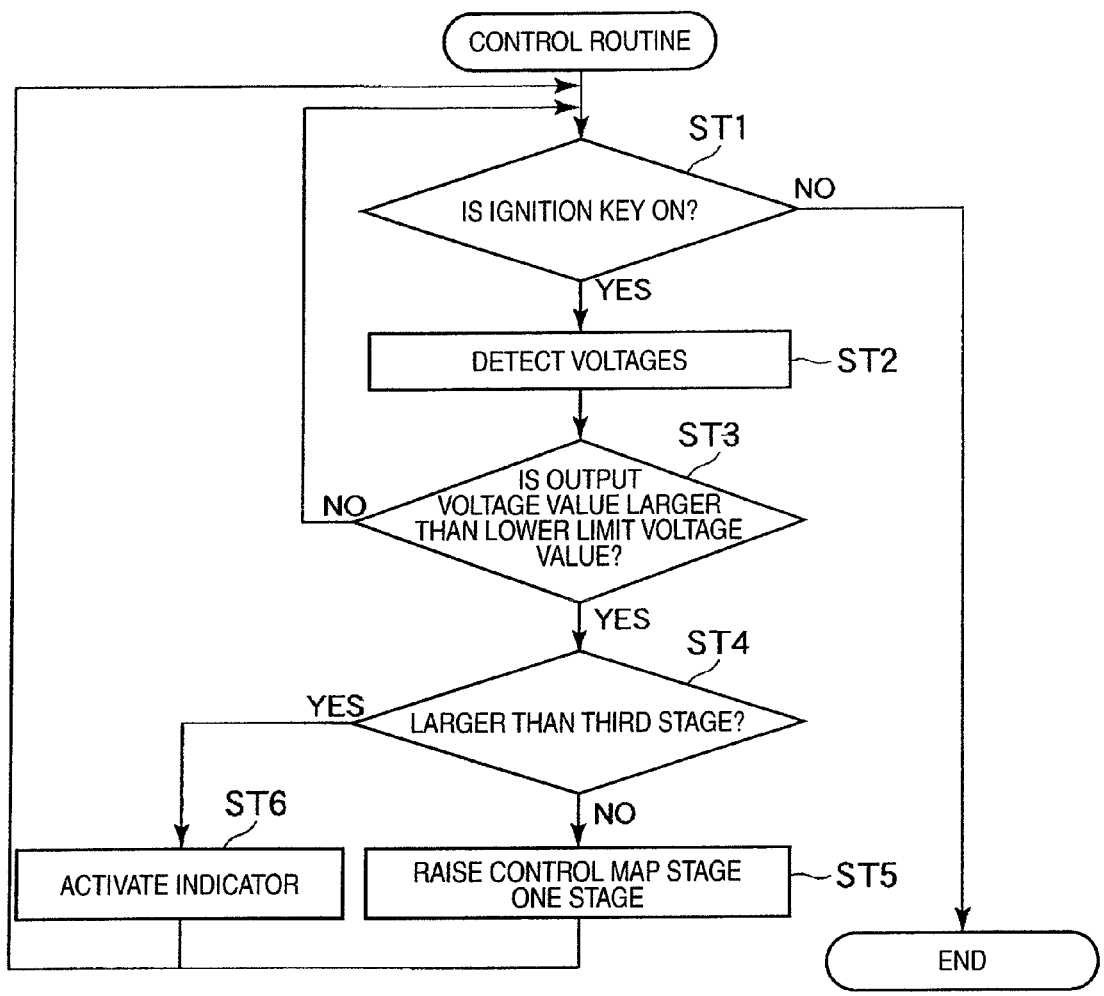
FIG. 19 is a flowchart illustrating the operation of the battery management control system of the embodiment.

Next, the operation of the battery management control system 20 will be described FIG. 19 is a flowchart illustrating the operation of the battery management control system 20. As is illustrated in FIG. 19, at step ST1, when an ignition key of the electric vehicle 10 is turned on (for example, when the ignition key is turned to a motor starting position to put the electric vehicle 10 into a drivable condition), the operation of the battery management control system 20 is started.

In the description of the operation of the battery management control system 20, as an example, a state is adopted in which the electric vehicle 10 is in a brand new state and none of the battery cells 16 has deteriorated at all. Because of this, the deteriorating state of the battery 14 is at the first stage. As an initial state, the first output control map group 41 and the first input control map group 51 are set in the battery management unit 250. When the operation (control) of the battery management control system 20 is started, the flow of operation proceeds to step ST2.

When the ignition key is turned on so as to bring the electric vehicle 10 into the drivable state and the electronic equipment becomes ready to be operated, the electric vehicle control unit 200 is triggered by the operation of the electronic equipment by an occupant or the depression of an accelerator pedal by the driver and then calculates a required electric power value (an electric power value requested from the battery 14 or an input value of electric power requested to be inputted into the battery cells 16).

In addition, the electric vehicle control unit 200 calculates a requested electric power value which is actually requested from the battery management unit 250 based on the first input and output control map groups 41, 51 (by comparing the required electric power value that is obtained in the way described above with the first input and output control map groups 41, 51). When receiving the required electric power value from the electric vehicle control unit 200, the battery management unit 250 inputs and outputs electric power into and from the battery cells 16.

As this occurs, of the first input and output control map groups 41, 52, a more appropriate map group is used based on information on temperatures detected by the battery cell monitoring parts 21.

At step ST2, the respective battery cell monitoring parts 21 detect output voltage values and input voltage values of the corresponding battery cells 16 to which the battery cell monitoring parts 21 are attached. Results of the detections by the battery monitoring parts 21 are then transmitted to the battery management unit 250.

The battery management unit 250 monitors output voltage values and input voltage values of the respective battery cells 16. In addition, the battery cell monitoring parts 21 detect output voltage values and input voltage values of the battery cells 16 at all times and transmit results of the detections to the battery management unit 250. Following this, the flow of operation proceeds to step ST3. In addition, the battery management unit 250 detects an output voltage value that is actually outputted from the battery 14 and an input voltage value that is actually inputted into the battery 14 based on the detection results of the respective battery cell monitoring parts 21.

At step ST3, the battery management unit 250 determines whether or not output voltage values of the respective battery cells 16 become smaller than the lower limit voltage value in the state which results before the electric power outputted from the battery 14 has reached the maximum output electric power value shown on the output control map. If it is determined at step ST3 that even one of output voltage values of the plurality of battery cells 16 (all of the battery cells 16) becomes smaller than the lower limit voltage value once in the state which results before the electric power outputted from the battery 14 has reached the maximum output electric power value shown on the output control map, the battery management unit 250 implements the first determination of deterioration. When the first determination of deterioration is so implemented, the flow of operation then proceeds to step ST4.

At step ST3, while it is not determined that any one of the output voltage values of the battery cells 16 becomes smaller than the lower limit voltage value once in the state which results before the electric power outputted from the battery 14 has reached the maximum output electric power value shown on the output control map, the flow of operation returns to step ST1 to repeat the operations at steps ST1 to step ST3.

At step ST4, the current deteriorating state of the respective battery cells 16, that is, at what stage the deteriorating state of the respective battery cells 16 stay is verified, and whether or not the deteriorating state of the battery cells 16 is at the third stage is verified. Since the deterioration stage has not yet been changed immediately after the first determination of deterioration was made, it is recognized that the battery 14 stays at the first stage. In this way, the stage resulting immediately before the determination of deterioration made at step ST3 is verified. Following this, the flow of operation proceeds to step ST5.

At step ST5, the stage of the deteriorating state of the respective battery cells 16 is raised one stage. The deteriorating state of the battery 14 is raised from the first stage to the second stage immediately after the first determination of deterioration has been made. Then, the battery management unit 250 changes the output control maps from the first output control map group 41 to the second output control map group 42. In addition, the battery management unit 250 changes the input control maps from the first input control map group 51 to the second input control map group 52.

Next, the flow of operation returns to step ST1. After this, the maximum input and output electric power values are managed by the use of the second input and output control map groups 42, 52. Then, until the second determination of deterioration is made, at steps ST2, ST3, the input and output voltage values of the respective battery cells 16, the output electric power value of the battery 14 and the temperature of the battery 14 are monitored by the battery management unit 250.

As time goes by, the deteriorating state of the battery 14 (the respective battery cells 16) progresses due to the electric vehicle 10 being driven or the regenerative brake system being operated during the time that has so elapsed, and if the second determination of deterioration is made at step ST3, the flow of operation passes step ST4 to proceed to step ST5. At step ST5, the battery management unit 250 changes the deteriorating state of the battery 14 (the respective battery cells 16) from the second stage to the third stage. Then, the battery management unit 250 changes the output and input control maps to the third input and output control map groups 43, 53. Thereafter, the flow of operation returns to step ST1.

After this, the maximum input and output electric power values are managed by the use of the third input and output control map groups 43, 53. Then, until the third determination of deterioration is made, at steps ST2, ST3, the input voltage value and output voltage value of the respective battery cells 16, the output electric power value of the battery 14 and the temperature of the battery 14 are monitored by the battery management unit 250.

Furthermore, as time goes by, the deteriorating state of the battery 14 (the respective battery cells 16) progresses due to the electric vehicle 10 being driven or the regenerative brake system being operated during the time that has so elapsed, and if the third determination of deterioration is made at step ST3, the flow of operation proceeds to step ST4.

At step ST4, it is determined that the deteriorating state of the battery 14 (the respective battery cells 16) stayed at the third stage immediately before the determination of deterioration was made at step ST3. Following this, the flow of operation proceeds to step ST6. At step ST6, the battery management unit 250 activates the indicator 60 so as to urge the driver to replace the battery 14 with a new one. Then, the battery management unit 250 changes the deteriorating state of the battery 14 (the respective battery cells 16) from the third stage to the fourth stage. Then, the flow of operation returns to step ST1. After this, the third input and output control map groups 43, 53 are used.

In addition, when the power supply of the electric vehicle 10 is switched off (in this embodiment, the ignition key is turned off), the operation of the battery management control system 20 is ended (the flow of operation in FIG. 9 proceeds to END).

As to information on the deterioration of the battery 14 (the battery cells 16), information resulting immediately before the ignition key is turned off is stored, for example, in the electric vehicle control unit 200, or the battery management unit 250 or both the units. When the ignition key is turned on again after it has been turned off, the control is started from step ST1 again. The deteriorating state and maps which are used then are the deteriorating state and maps which resulted when the ignition key was last turned off.

In addition, in the midst of control of the battery 14, the maps of the respective map groups 41 to 43, 51 to 53 are used whose temperature zones (the first to fifth states) match the temperature of the battery 14 which is determined based on temperature information of the respective battery cells 16 which are transmitted from the corresponding battery cell monitoring parts 21 (in this embodiment, as an example, a lowest one of the temperatures of the battery cells 16 is made to constitute the temperature of the battery 14).

In the battery management control system 20 that is configured in the way described above, when confirming that there is caused a difference between the performance of the battery 14 shown on the map and the actual performance of the battery 14 by implementing the first to third determinations of deterioration, the battery management unit 250 changes the maps.

Namely, since the maps are changed as a result of the estimation of the deteriorating state of the battery 14, the maps can be used which match the performance of the battery 14. Because of this, the occurrence of difference between the performance of the battery 14 shown on the map and the actual performance of the battery 14 is suppressed.

In addition, the battery cell monitoring parts 21 and the battery management unit 250 are such as to be used to manage the whole of the battery cells 16 or the battery 14. In addition, the electric vehicle control unit 200 is such as to be used to control the operations of the battery 14, the motor 12, the air conditioner 210 and the electric vehicle 10.

Namely, the battery management control system 20 is made up of existing devices. Alternatively, the battery management control system 20 is made up by making use of the existing devices. Because of this, no special device has to be prepared separately. Alternatively, since the separate preparation of any special device is suppressed, the production costs can be suppressed to a low level.

In addition, since the output voltage is used as the condition of the determination of deterioration, the determination of deterioration can easily be implemented. In addition, the battery 14 can be controlled by the use of the maps which match the temperature (in this embodiment, the first to fifth states) of the battery 14 by the battery cell monitoring parts 21 detecting the temperatures of the battery cells 16. In addition, by providing the plurality of maps in such a manner as to match the degrees of deterioration of the battery 14, the battery 14 can be controlled by the use of appropriate maps which match the deteriorating state of the battery 14.

In this embodiment, while the first to third output control map groups 41 to 43 are used, the number of map groups to be used is not limited to three. Similarly, as to the number of input control map groups to be used, the number of map groups is not limited to three groups (51 to 53). Depending upon the deteriorating state of the battery 14, two, four, five or any other number of map groups may be used (each map group includes maps associated with the respective temperature zones, and therefore, the map group includes the plurality of maps).

In addition, in the description of the operation of the battery management control system 20, while in the event that there is caused a difference in degree of development of the deteriorating state of the battery cells 16 (a specific battery cell 16 deteriorates earlier than the other battery cells 16) the battery management unit 250 is made to replace the maps in association with an earliest deterioration in deteriorations of the battery cells 16, the invention is not limited thereto (specifically, the maps are replaced even any one of the battery cells 16 is determined to deteriorate the predetermined number of times (once and the plurality of times included) or the predetermined number or more of times).

For example, the battery 14 may be determined to have deteriorated in the event that the output voltage values of any predetermined number of battery cells 16 (for example, a preset number such as two or three) in all of the battery cells 16 become lower than the lower limit voltage value a predetermined number of times (a preset number of times which includes once and a plurality of times) or the predetermined number or more of times (when the battery cells 16 deteriorate, in the event that the deterioration determination conditions are met).

In addition, the operation of the battery management control system 20 (the flowchart shown in FIG. 19) is just the example, and hence, the invention is not limited thereto.

Next, a battery management control system according to a second embodiment of the invention will be described by the use of FIG. 20. Like reference numerals will be imparted to constitutions having like functions to those of the first embodiment, so as to omit the repetition of the same description. In this embodiment, a deterioration determination condition adopted by a battery management unit 250 will be different from that of the first embodiment. The other features of the second embodiment may be the same as the first embodiment. Therefore, what is different from the first embodiment will be described herein.

Figure 20:
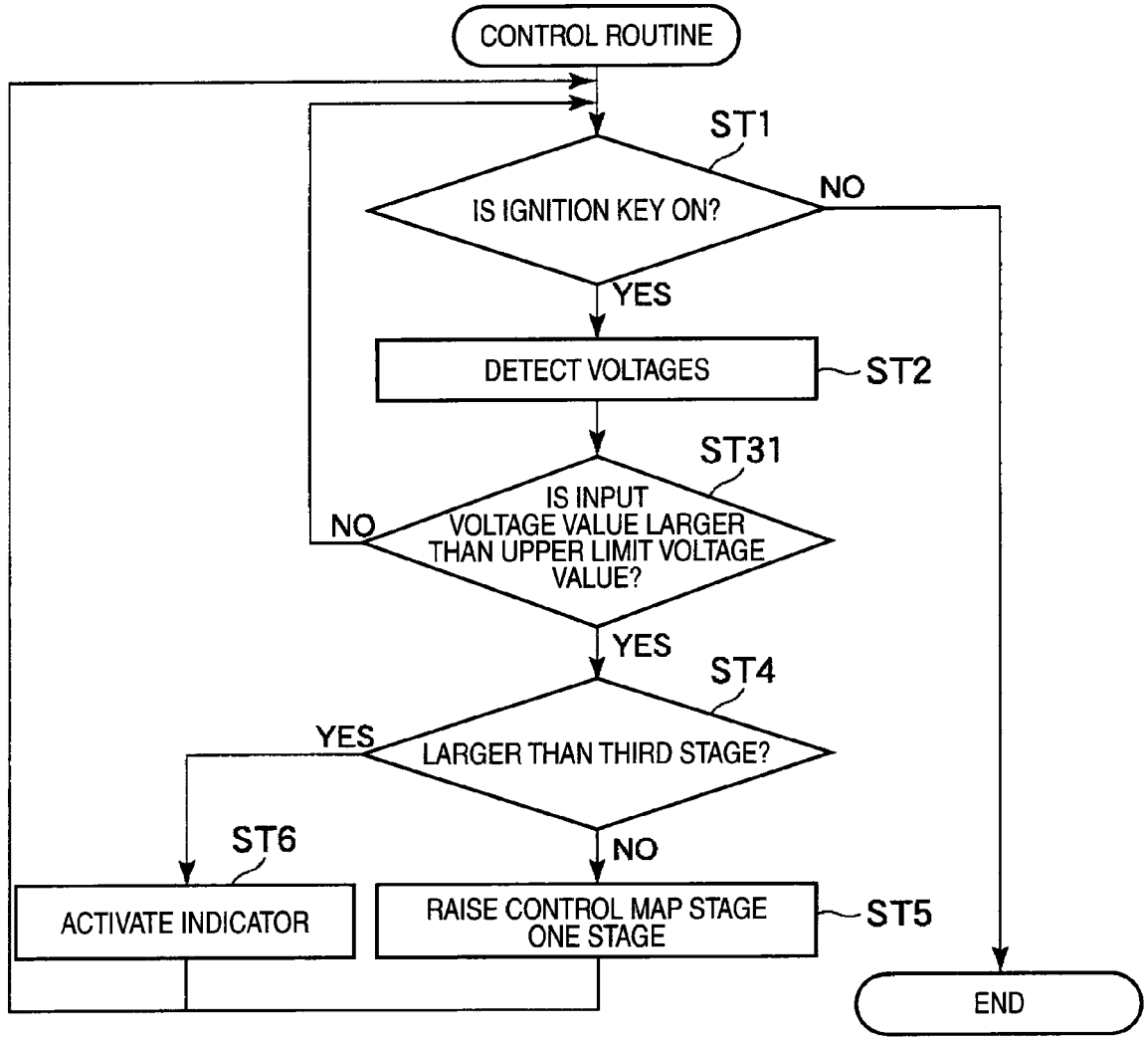
FIG. 20 is a flowchart illustrating the operation of a battery management control system according to a second embodiment of the invention.

FIG. 20 is a flowchart which illustrates the operation of a battery management control system 20 of this embodiment. In this embodiment, in place of the determination of deterioration based on the output voltage values of the battery cells 16, a battery management unit 250 determines the deterioration of a battery cell 16 based on an input voltage value inputted into the battery cell 16.

Specifically, when charging a battery 14 by a regenerative brake system or an external power supply, in the event that an input voltage value inputted into a battery cell 16 becomes larger than an upper limit voltage value, the battery management unit 250 determines that the battery 14 has deteriorated to such an extent that the battery 14 cannot be controlled by maps (any map group in first to third electric power input control map groups 51 to 53 which is in use), and a deterioration stage is increased one stage.

Next, the operation of the battery management control system 20 of this embodiment will be described by the use of FIG. 20. The flowchart shown in FIG. 20 is substantially the same as the flowchart shown in FIG. 19 but is different in a point in which a step ST31 is used in place of the step ST3. The other steps may be the same as the steps of the first embodiment (FIG. 19). Then, step ST31 will be described below.

When an operation at step ST2 ends, the flow of operation proceeds to step ST31. At step ST31, in a case where the regenerative brake system is in operation or in a case where electric power is being supplied from the external power supply, it is determined whether or not a voltage value that is inputted into each battery cell 16 becomes larger than the upper limit voltage value once in a state which results before an input electric power value inputted into the battery 14 reaches a maximum input electric power value shown on the map.

If it is determined at step ST31 that even any one of input voltage values inputted into the battery cells 16 becomes larger than the upper limit voltage value once in the state which results before the input electric power value inputted into the battery 14 reaches the maximum input electric power value shown on the map, a determination of deterioration of the battery 14 is made.

In the event that the battery 14 stays at a first stage, a first determination of deterioration is made. In the event that the battery 14 stays at a second stage, a second determination of deterioration is made. In the event that the battery 14 stays at a third stage, a third determination of deterioration is made.

If even any one of input voltage values inputted into the battery cells 16 becomes larger than the upper limit voltage value once in the state which results before the input electric power value inputted into the battery 14 reaches the maximum input electric power value shown on the map, the flow of operation proceeds to step ST4. If input voltage values inputted into all the battery cells 16 are equal to or smaller than the upper limit voltage value, the flow of operation returns to step ST1.

The second embodiment can obtain the same advantage as that obtained by the first embodiment. In addition, the determination of deterioration can easily be implemented by using the input voltage as the deterioration determination condition.

In the second embodiment, while in the state which results before an input electric power value inputted into the battery 14 reaches the maximum input electric power value shown on the map, if it is determined that even anyone of input voltage values inputted into the battery cells 16 (an input voltage value of any one of the plurality of battery cells 16) becomes larger than the upper limit voltage value once, the determination of deterioration is carried out, the invention is not limited thereto.

As with the first embodiment, in the event that the input voltage value of even any one of the plurality of battery cells 16 becomes larger than the upper limit voltage value twice, three times or four times (in the event that the deterioration determination condition is met), the determination of deterioration may be made to be made. As this occurs, the "plurality of times" constitutes the predetermined number of times. The predetermined number of times is preset. Alternatively, the number of times of any one of input voltage values of the plurality of battery cells 16 exceeding the upper limit voltage value may be made to be the predetermined number or more of times. Alternatively, the determination of deterioration may be made to be implemented in the event that input voltage values of a predetermined number of battery cells 16 (a plurality of battery cells more than one including two and three battery cells, which is a preset number) exceeds the upper limit voltage value a predetermined number of times (once or a plurality of times) or the predetermined number or more of times (in the event that the deterioration determination condition is met).

Figure 21:
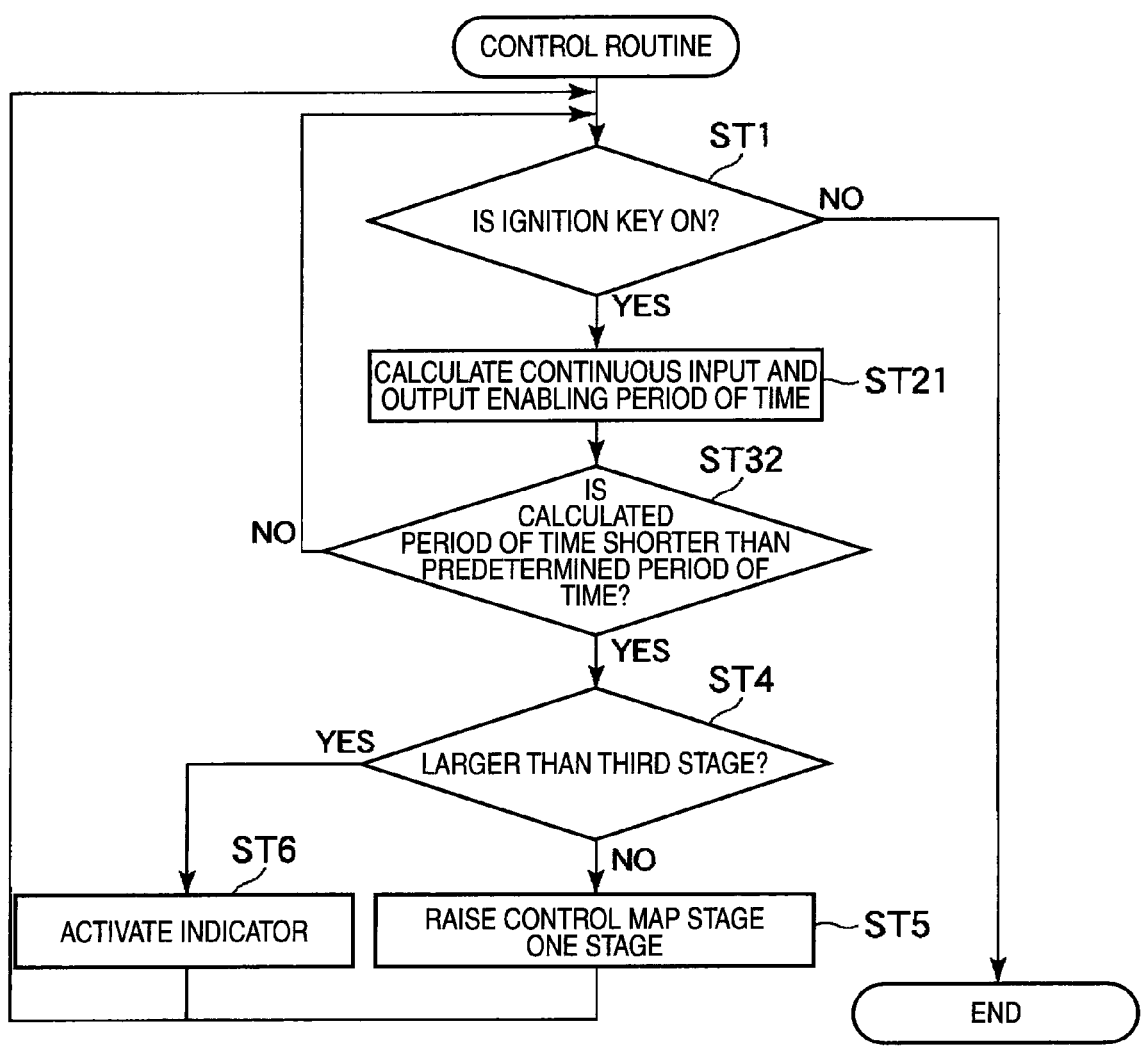
FIG. 21 is a flowchart illustrating the operation of a battery management control system according to a third embodiment of the invention.

Next, a battery management control system according to a third embodiment of the invention will be described by the use of FIG. 21. Like reference numerals will be imparted to constitutions having like functions to those of the first embodiment, so as to omit the repetition of the same description. In this embodiment, a deterioration determination condition adopted by a battery management unit 250 will be different from that of the first embodiment. The other features of the third embodiment may be the same as the first embodiment. Therefore, what is different from the first embodiment will be described herein.

In this embodiment, in addition to the function described in the first embodiment, battery cell monitoring parts 21 have a function to detect residual electric energies (charging rates) of battery cells 16. The battery management unit 250 detects continuous input and output times of maximum input and output electric power values of the battery cells 16 based on residual electric energies (charging rates) of the battery cells 16 which are reported from the respective battery cell monitoring parts 21. In addition, the battery management unit 250 determines based on output results from the battery cell monitoring parts 21 whether or not a battery 14 can output a maximum output electric power value shown on an output control map for predetermined periods of time which are required at respective stages.

Similarly, the battery management unit 250 determines based on the output results from the battery cell monitoring parts 21 whether or not a maximum input electric power value shown on an input control map can be inputted into the battery 14 for predetermined periods of time which are required at the respective stages.

Here, the predetermined periods of time will be described. The period of time over which the battery 14 can output continuously the maximum output electric power value shown on the map changes in accordance with the deterioration stage of the battery 14. As the deterioration of the battery 14 progresses, the time over which the battery 14 can output continuously the maximum output electric power value shown on the map decreases.

For example, at a first stage, the predetermined period of time is 60 seconds. At a second stage, the predetermined period of time is 45 seconds. At a third stage, the predetermined period of time is 30 seconds.

Similarly, the period of time over which the maximum input electric power value can continuously be inputted into the battery 14 changes as the stages change. As an example of continuous input times required for the battery cells 16, at the first stage, the continuous input time is 60 seconds. At the second stage, the continuous input time is 45 seconds. At the third stage, the continuous input time is 30 seconds. The data obtained during such predetermined periods of time are held, for example, in the battery management unit 250.

In this embodiment, in place of the determination of deterioration based on the output voltage values of the battery cells 16, the battery management unit 250 implements the determination of deterioration of the battery 14 based on a comparison between the continuous input and output times of the maximum input and output electric power values into and from the battery 14 and the predetermined periods of time.

Specifically, in the event that the battery management unit 250 determines that the battery 14 cannot continue to output the maximum output electric power value shown on the map for the predetermined period of time which is preset, the battery management unit 250 then determines that the battery 14 has deteriorated. In addition, in the event that the battery management unit 250 determines that the maximum input electric power value shown on the map cannot be continuously inputted into the battery 14 for the predetermined period of time which is preset, the battery management unit 250 then determines that the battery 14 has deteriorated.

Next, the operation of the battery management control system 20 of the embodiment will be described by the use of FIG. 21. FIG. 21 is a flowchart which illustrates the operation of the battery management control system. Although the flowchart shown in FIG. 21 is substantially the same as the flowchart of the first embodiment shown in FIG. 19, the former flowchart differs from the latter flowchart in that step ST21 is used in place of step ST2 and in that step ST32 is used in place of step ST3. The other steps of the third embodiment may be the same as the first embodiment. Steps ST21 and ST32 will be described below.

When an operation at step ST1 ends, the flow of operation proceeds to step ST21. At step ST21, the battery management unit 250 calculates from information sent from battery cell monitoring parts 21 based on charging rates of respective battery cells 16 a period of time over which the battery 14 can continue to output the maximum output electric power value shown on the output control map and a period of time over which the maximum input electric power value shown on the input control map can continuously be inputted into the battery 14. Following this, the flow of operation proceeds to step ST32.

At step ST32, the battery management unit 250 compares the period of time which was calculated at step ST21 as the period of time over which the maximum output electric power value can continue to be outputted from the battery 14 with a predetermined period of time that is required for the battery 14 as a period of time for output (and which is set for each stage). Similarly, at step ST32, the battery management unit 250 compares the period of time which was calculated at step ST21 as the period of time over which the maximum input electric power value can continue to be inputted into the battery 14 with a predetermined period of time that is required for the battery 14 as a period of time for input (and which is set for each stage).

In the event that the period of time over which the maximum output electric power value shown on the map can be outputted is shorter than the predetermined period of time, the battery management unit 250 determines that the battery 14 has deteriorated. Similarly, in the event that the maximum input electric power value shown on the map can be inputted is shorter than the predetermined period of time, the battery management unit 250 determines that the battery 14 has deteriorated.

The battery management unit 250 implements a first determination of deterioration when the battery cells 16 are at a first stage. The battery management unit 250 implements a second determination of deterioration when the battery cells 16 are at a second stage. The battery management unit 250 implements a third determination of deterioration when the battery cells 16 are at a third stage. Following this, the flow of operation proceeds to step ST4.

If the battery management unit 250 determines that the maximum output electric power value can be outputted from the battery 14 over the predetermined period of time, the flow of operation returns to step ST1. Similarly, if the battery management unit 250 determines that the maximum input electric value can be inputted into the battery 14 over the predetermined period of time, the flow of operation returns to step ST1.

The third embodiment can obtain the same advantage as that obtained by the first embodiment. In addition, by using the comparison between the periods of time over which the maximum input and output electric power values shown on the maps can continue to be inputted into and outputted from the battery 14 with the predetermined periods of time, the determination of deterioration can easily be implemented.

In this embodiment, while in the event that it is determined once that the periods of time over which the maximum input and output electric power values can be inputted into and outputted from the battery 14 are shorter than the predetermined periods of time (in the event that the deterioration determination conditions are met), the determination of deterioration is implemented to change the stages, the invention is not limited thereto. As with the first embodiment, a plurality of times such as twice or three times may be made to constitute a predetermined number of times, so that the determination of deterioration is implemented in the event that the deterioration determination condition is met the predetermined number of times. In addition, the number of times of the deterioration determination condition being met may be made to the predetermined number of more of times in consideration of detection errors.

Next, a battery management control system according to a fourth embodiment of the invention will be described by the use of FIG. 22. Like reference numerals will be imparted to constitutions having like functions to those of the first to third embodiments, so as to omit the repetition of the same description. In this embodiment, a battery management unit 250 employs the deterioration determination conditions described in the first to third embodiments to make a determination of deterioration. The other constitutions may be the same as those of the first embodiment. Therefore, the aforesaid feature which differs from the other embodiments will be described below.

Figure 22:
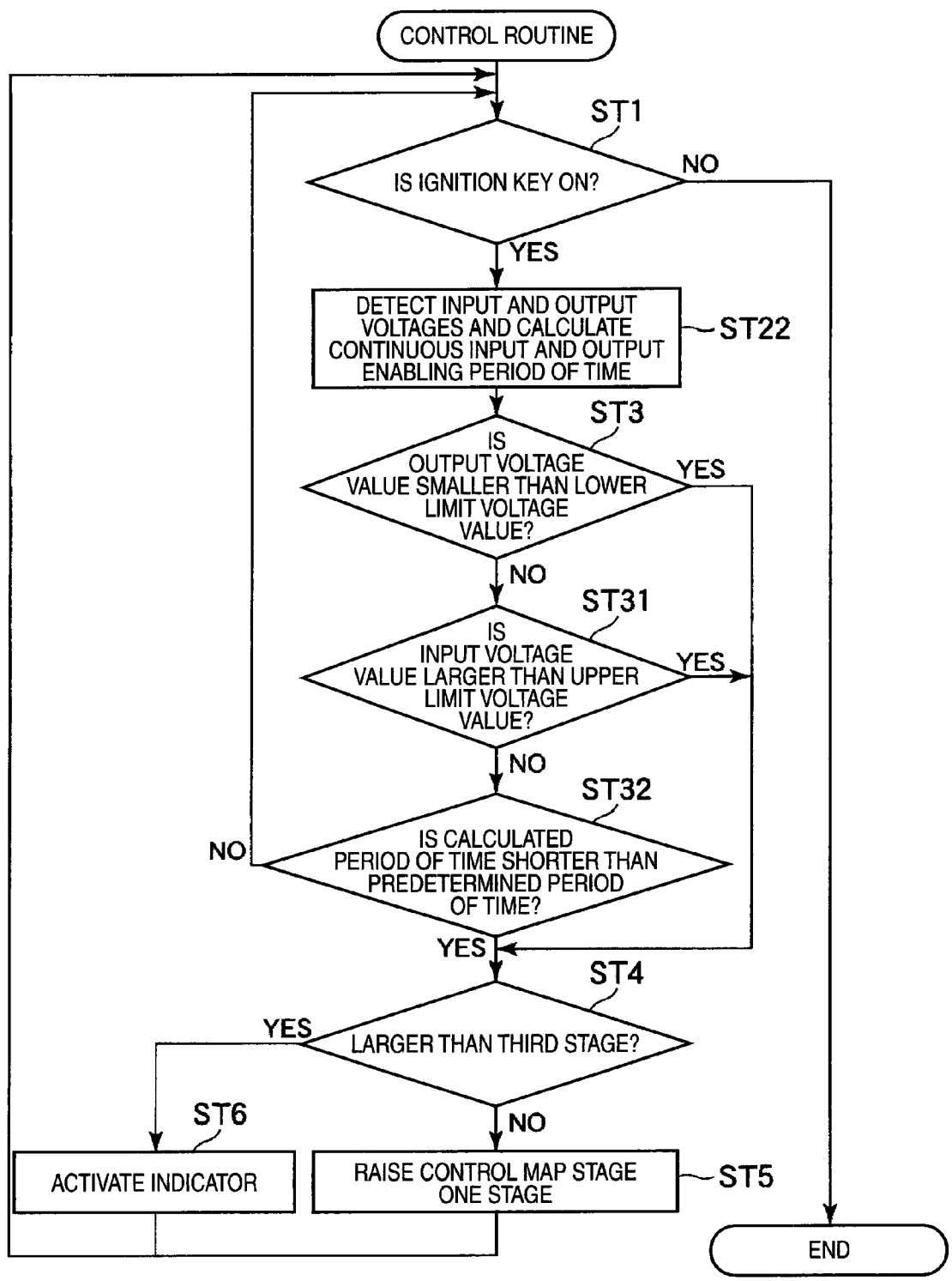
FIG. 22 is a flowchart illustrating the operation of a battery management control system according to a fourth embodiment of the invention.

FIG. 22 shows a flowchart which illustrates the operation of a battery management control system 20 of this embodiment. Although the flowchart shown in FIG. 22 is substantially the same as the flowchart shown in FIG. 19, the former flowchart differs from the latter flowchart in that step ST22 is used in place of step ST2 and in that the former flowchart includes step ST31 which was described in the second embodiment and step ST32 which was described in the third embodiment. The other steps may be the same as the first embodiment.

In this embodiment, it is determined that a battery 14 has deteriorated in the event that at least one of the following three deterioration determination conditions is met; in the event that the output voltage value of any one of battery cells 16 becomes smaller than a lower limit voltage value (which was described in the first embodiment), in the event that the input voltage value inputted into any one of battery cells 16 becomes larger than an upper limit voltage value (which was described in the second embodiment), or in the event that maximum input and output electric power values shown on input and output control maps cannot continue to be inputted into and outputted from the battery 14 over predetermined periods of time (which was described in the third embodiment).

Next, the operation of the battery management control system 20 of the embodiment will be described by the use of FIG. 22. As is shown in FIG. 22, when an operation at step ST1 ends, the flow of operation proceeds to step ST22.

At step ST22, respective battery cell monitoring parts 21 detect output voltage values and input voltage values of battery cells 16 to which the battery cell monitoring parts 21 are attached. Results of the detections are transmitted to a battery management unit 250. The battery management unit 250 monitors the output voltage values and the input voltage values of the respective battery cells 16.

In addition, at step ST22, the respective battery cell monitoring parts 21 detect charging rates (residual electric energies) of the battery cells 16 to which the battery cell monitoring parts 21 are attached. Results of the detections are transmitted to the battery management unit 250. The battery management unit 250 calculates based on the charging rates of the respective battery cells 16 a period of time over which the battery 14 can continue to output the maximum output electric power value shown on the map and a period of time over which the maximum input electric power value shown on the map can continue to be inputted into the battery 14.

It should be noted that the battery cell monitoring parts 21 detect the output voltage values, the input voltage values and the charging rates of the battery cells 16 at all times and transmits results of the detections to the battery management unit 250. Following this, the flow of operation proceeds to step ST3.

At step ST3, it is determined whether or not the output voltage of any one of the battery cells 16 becomes smaller than the lower limit voltage value once in a state which results before an electric power value which is outputted from the battery 14 reaches the maximum output electric power value shown on the map.

If it is determined at step ST3 that the output voltage of any one of the battery cells 1E has become smaller than the lower limit voltage value once in the state resulting before the state which results before an electric power value which is outputted from the battery 14 reaches the maximum output electric power value shown on the map, the battery management unit 250 implements a determination of deterioration. Once the determination of deterioration has been made, the flow of operation proceeds to step ST4.

If the battery management unit 250 determines at step ST3 that the output voltage value is equal to or larger than the lower limit voltage value, the flow of operation proceeds to step ST31.

When a regenerative brake system is in operation or electric power is being supplied to the battery 14 from an external power supply, it is determined at step ST31 whether or not an input voltage has become larger than an upper limit voltage value once in a state which results before an electric power value inputted into the battery 14 reaches the maximum input electric power value shown on the map.

If it is determined at step ST31 that the input voltage has become larger than the upper limit voltage value even once in the state resulting before the electric power value inputted into the battery 14 reaches the maximum input electric power value shown on the map, the battery management unit 250 implements the determination of deterioration. Once the determination of deterioration is made, the flow of operation proceeds to step ST4.

If it is determined at step ST31 that the input voltage value is equal to or smaller than the upper limit voltage value, the flow of operation proceeds to step ST32.

At step ST32, the battery management unit 250 compares the period of time over which the battery 14 can continue to output the maximum output electric power value shown on the map with a predetermined period of time which is preset. In addition, the battery management unit 250 compares the period of time over which the maximum input electric power value shown on the map can continue to be inputted into the battery with a predetermined period of time which is preset.

It the battery management unit 250 determines at step ST32 that the calculated period of time is shorter than the predetermined period of time, the battery management unit 250 implements the determination of deterioration. Once the determination of deterioration has been made, the flow of operation proceeds to step ST4.

If the battery management unit 250 determines at step ST32 that the calculated period of time is equal to or longer than the predetermined period of time, the flow of operation returns to step ST1. Then, the operations from ST1 to ST32 will continue to be carried out until the determination of deterioration is made at steps ST3, ST31, ST32.

It should be noted that at the aforesaid steps ST3, ST31, ST32, when the battery 14 is at a first stage, a first determination of deterioration is made. When the battery 14 is at a second stage, a second determination of deterioration is made. When the battery 14 is at a third stage, a third determination of deterioration is made.

The fourth embodiment can also obtain the same advantage as that obtained by the first embodiment. Furthermore, since not one but three deterioration determination conditions (output voltage value, input voltage value, electric power input and output periods of time) are employed, the deterioration of the battery 14 can be determined with higher accuracy.

In addition, at steps ST3, ST31, ST32, while the determination of deterioration is made to be made in the event that the output voltage value of any one of the plurality of battery cells 16 becomes smaller than the lower limit voltage value even once, in the event that the input voltage value of any one of the plurality of battery cells 16 becomes larger than the upper limit voltage value even once, and in the even that the calculated period of time becomes shorter than the predetermined period of time even once, the invention is not limited thereto. As with the first to third embodiments, a plurality of times including twice, three times and four times is made to constitute the predetermined number of times, so that the determination of deterioration may be made to be implemented in the event that the aforesaid conditions occur the predetermined number of times or the predetermined number of more of times in consideration of detection errors. In addition, the determination of deterioration may be made to be implemented in the event that a predetermined plural number of battery cells 16 including two or three battery cells 16 (which is a preset number) of the plurality of battery cells 16 have reached the aforesaid deterioration determination conditions (the predetermined number of times or the predetermined number or more of times).

In addition, the order in which the operations of steps ST3, ST31, ST32 are implemented is not limited to the order described above. For example, the operations may be implemented in the order of steps ST32, ST31, ST3.

Next, a battery management control system according to a fifth embodiment of the invention will be described by the use of FIG. 23. Like reference numerals will be imparted to constitutions having like functions to those of the fourth embodiment, so as to omit the repetition of the same description. In this embodiment, the function of a battery management unit 250 differs from that of the battery management unit 250 of the fourth embodiment. The other features may be the same as those of the fourth embodiment. The aforesaid different feature will be described below.

Figure 23:
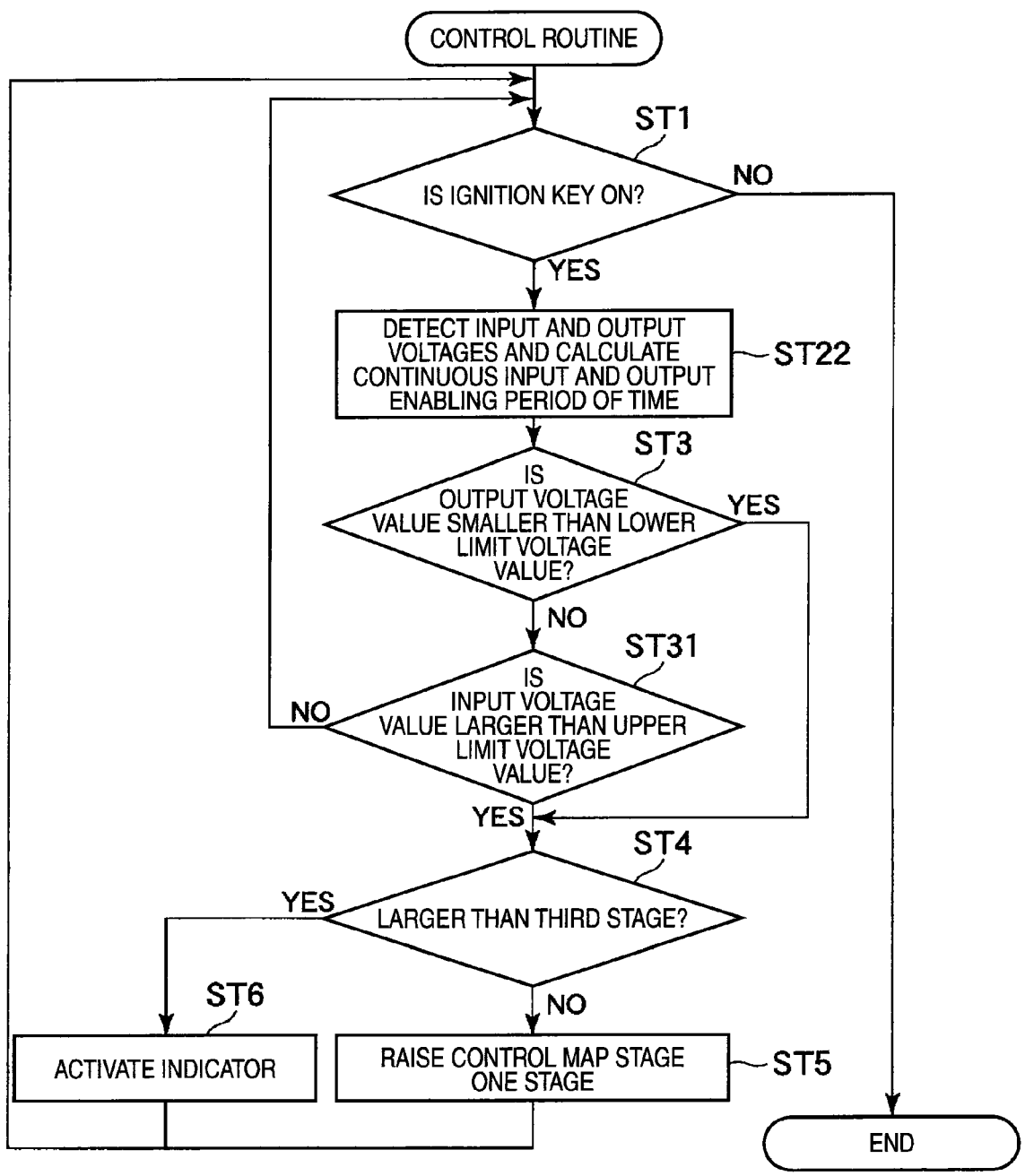
FIG. 23 is a flowchart illustrating the operation of a battery management control system according to a fifth embodiment of the invention.

As is shown in FIG. 23, in this embodiment, step ST32 which was described in the fourth embodiment is omitted, and hence, as deterioration determinations, output voltage values and input voltage values will be monitored at steps ST3, ST31. In this embodiment, it no determination of deterioration is made at steps ST3, ST31, the flow of operation is made to return to step ST1.

Also in this embodiment, by the use of the plurality of deterioration determination conditions, the same advantage as that of the fourth embodiment can be obtained.

Next, a battery management control system according to a sixth embodiment of the invention will be described by the use of FIG. 24. Like reference numerals will be imparted to constitutions having like functions to those of the fourth embodiment, so as to omit the repetition of the same description. In this embodiment, the function of a battery management unit 250 differs from that of the battery management unit 250 of the fourth embodiment. The other features may be the same as those of the fourth embodiment. The aforesaid different feature will be described below.

Figure 24:
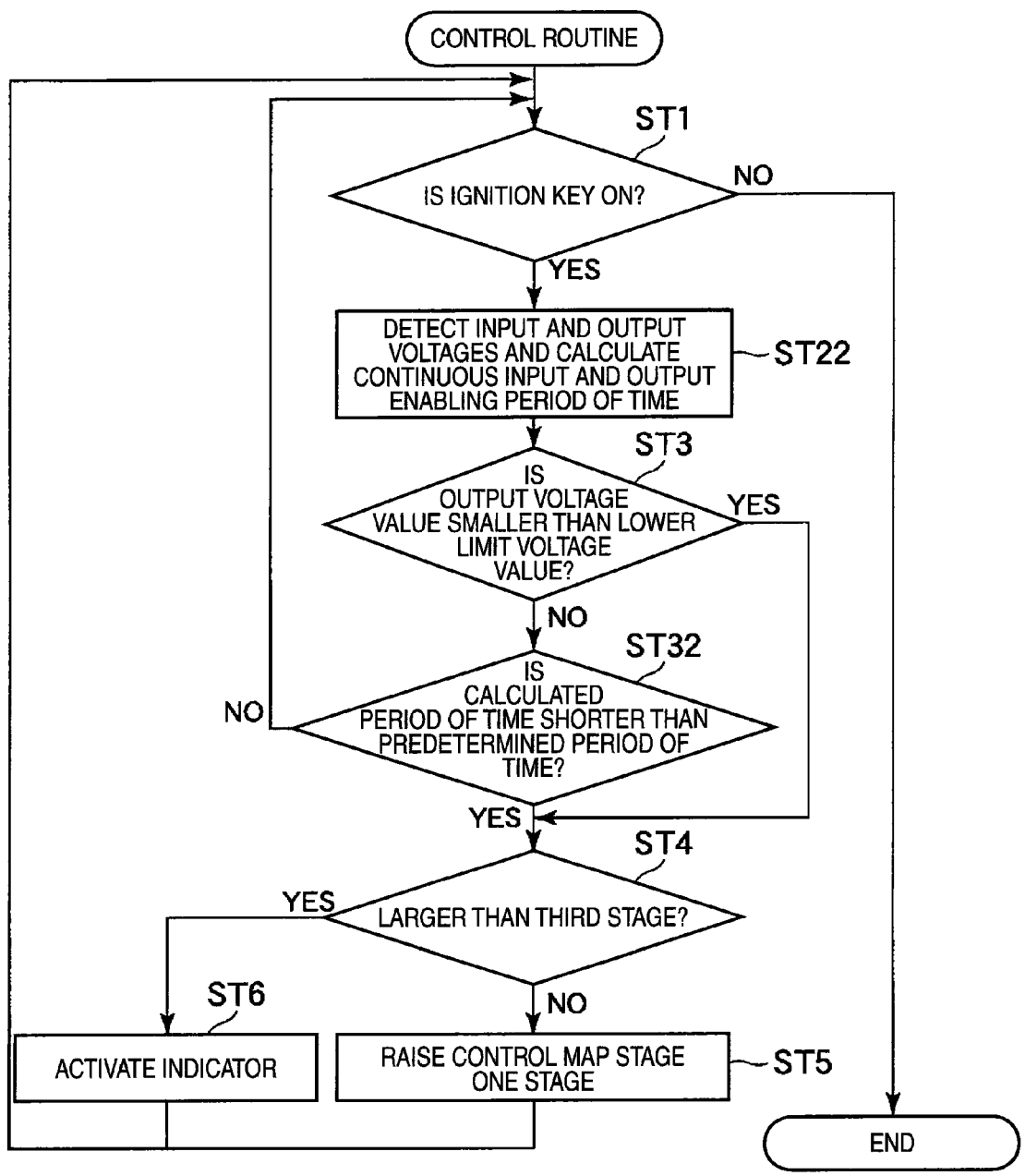
FIG. 24 is a flowchart illustrating the operation of a battery management control system according to a sixth embodiment of the invention.

As is shown in FIG. 24, in this embodiment, step ST31 which was described in the fourth embodiment is omitted, and hence, as deterioration determinations, output voltage values and electric power input and output enabling periods of time will be monitored at steps ST3, ST32. In this embodiment, it no determination of deterioration is made at steps ST3, ST32, the flow of operation is made to return to step ST1.

Also in this embodiment, by the use of the plurality of deterioration determination conditions, the same advantage as that of the fourth embodiment can be obtained.

Next, a battery management control system according to a seventh embodiment of the invention will be described by the use of FIG. 25. Like reference numerals will be imparted to constitutions having like functions to those of the fourth embodiment, so as to omit the repetition of the same description. In this embodiment, the function of a battery management unit 250 differs from that of the battery management unit 250 of the fourth embodiment. The other features may be the same as those of the fourth embodiment. The aforesaid different feature will be described below.

Figure 25:
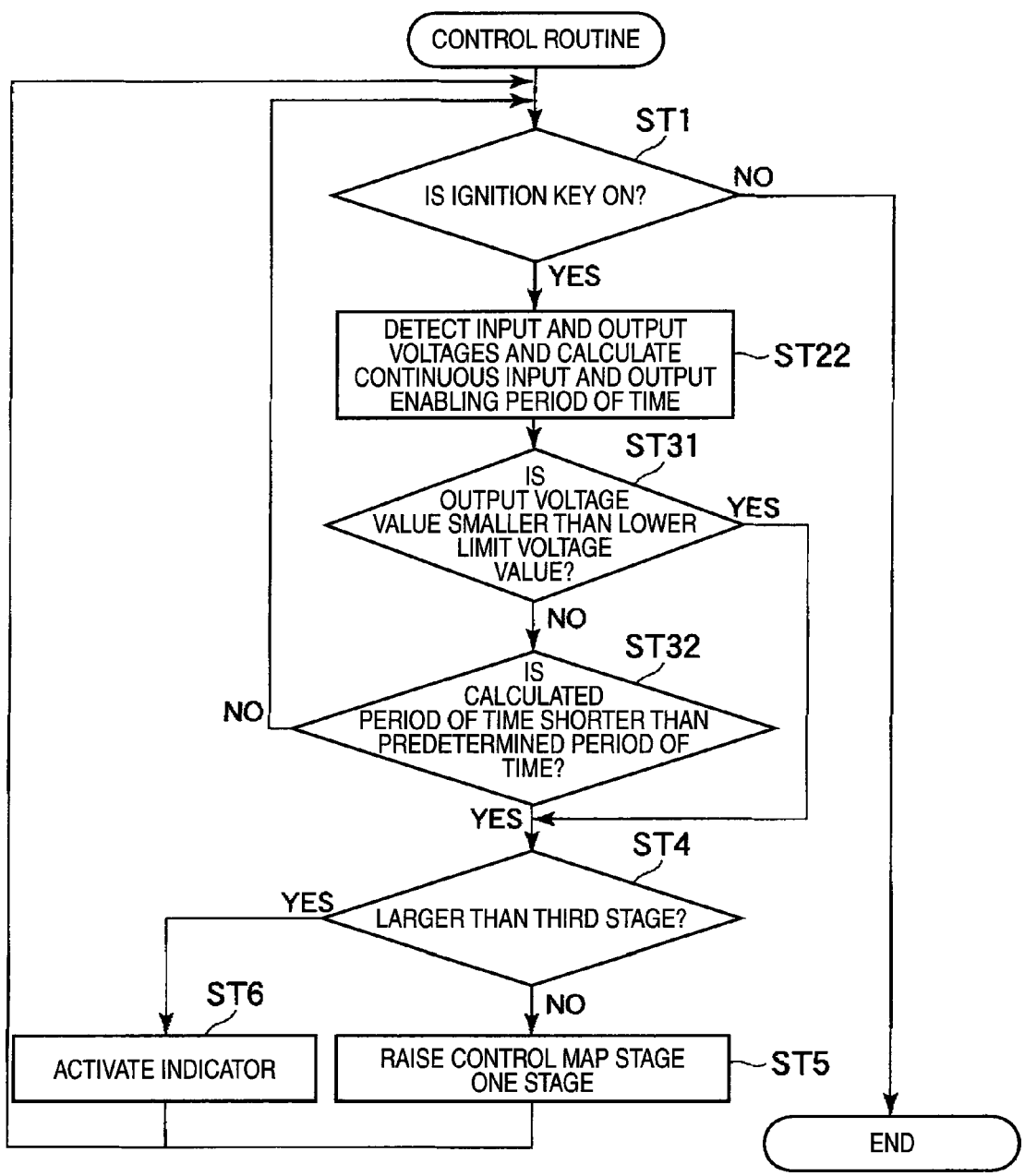
FIG. 25 is a flowchart illustrating the operation of a battery management control system according to a seventh embodiment of the invention.

As is shown in FIG. 25, in this embodiment, step ST3 which was described in the fourth embodiment is omitted, and hence, as deterioration determinations, input voltage values and electric power input and output enabling periods of time will be monitored at steps ST31, ST32. In this embodiment, if no determination of deterioration is made at steps ST31, ST32, the flow of operation is made to return to step ST1.

Also in this embodiment, by the use of the plurality of deterioration determination conditions, the same advantage as that of the fourth embodiment can be obtained.

Next, a battery management control system according to an eighth embodiment of the invention will be described by the use of FIG. 26. Like reference numerals will be imparted to constitutions having the same functions as those of the first embodiment, so as to omit the repetition of the same description. A battery management unit 250 and an electric vehicle control 3 unit 200 of this embodiment differ from those of the first embodiment. The other features of the embodiment may be the same as those of the first embodiment. The aforesaid different features will be described below.

Figure 26:
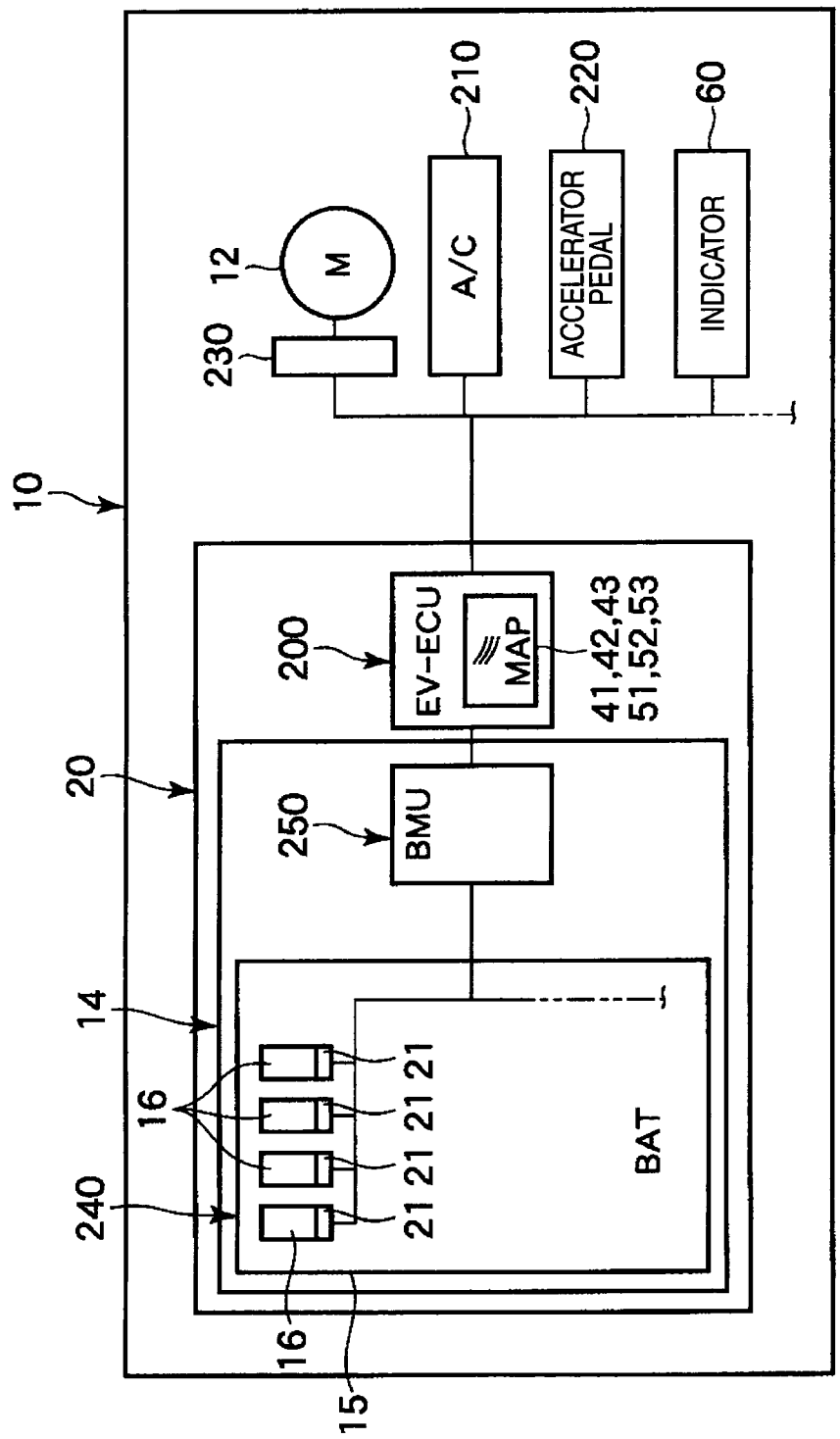
FIG. 26 is a block diagram schematically showing an electric vehicle which includes a battery management control system according to an eighth embodiment of the invention.

FIG. 26 is a block diagram which schematically shows an electric vehicle 10 including a battery management control system 20 of this embodiment. As is shown in FIG. 26, in this embodiment, an electric vehicle control unit 200 has first to third output control map groups 41 to 43 and first to third input control map groups 51 to 53, while the battery management unit 250 has those map groups in the other embodiments that have been described heretofore.

The electric vehicle control unit 200 requests electric power that is considered to be able to be outputted from and inputted into a battery 14 based the first to third output control map groups 41 to 43 and the first to third input control map groups 51 to 53 from the battery management unit 250.

Then, if the battery management unit 250 determines at step ST3 that the battery 14 has deteriorated, at step ST5, the battery management unit 250 requests the electric vehicle control unit 200 to update the maps. When it has received the request for update, the electric vehicle control unit 200 updates the maps in such a manner as to be associated with a deterioration stage (replaces the maps with maps which are prepared separately). In this embodiment, the same advantage as that obtained by the first embodiment can be obtained.

It should be noted that in the event that the electric vehicle control unit 200 is made to have the first output control map groups 41 to 43 and the first to third input control map groups 51 to 53 instead of the battery management unit 250 also in the second to seventh embodiments, the same advantages as those currently obtained by the second to seventh embodiments can be obtained.

Next, a battery management control system 20 according to a ninth embodiment of the invention will be described by the use of FIGS. 27 to 30. Like reference numerals will be imparted to constitutions having the same functions as those of the first embodiment, so as to omit the repetition of the same description. Input and output control maps and a battery management unit 250 of this embodiment differ from those of the first embodiment. The other features of the embodiment may remain the same as those of the first embodiment. The different features will be described below.

A battery management unit 250 has a single output control map 70 in place of the first to third output control map groups 41 to 43. In addition, the battery management unit 250 has a single input control map 80 in place of the first to third input control map groups 51 to 53.

Figure 27:
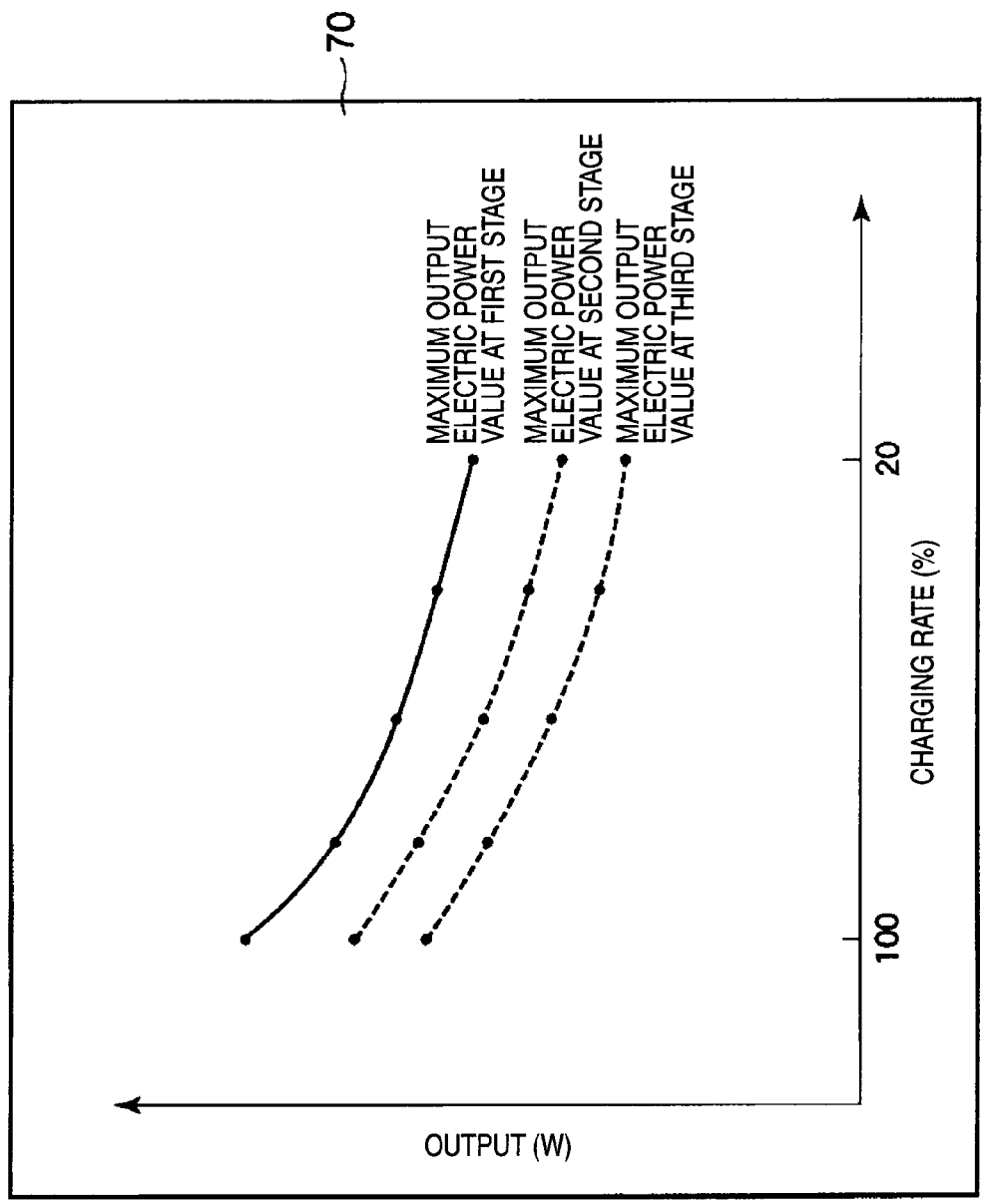
FIG. 27 is a graph showing an output control map of a battery management control system according to a ninth embodiment of the invention.

FIG. 27 shows an output control map 70 in a fifth state. In FIG. 27, a maximum output electric power value corresponding to a charging rate of the output control map 70 in an initial state is indicated by a solid line. The initial state of the output control map 70 means a period of time which lasts from a state in which a battery 14 (battery cells 16) has not yet deteriorated until a first determination of deterioration is made. Namely, the initial state denotes a first stage. Axes of abscissas and ordinates of the output control map 70 are the same as those of the first to third output control map groups 41 to 43 shown in FIGS. 3 to 5, respectively.

Figure 28:
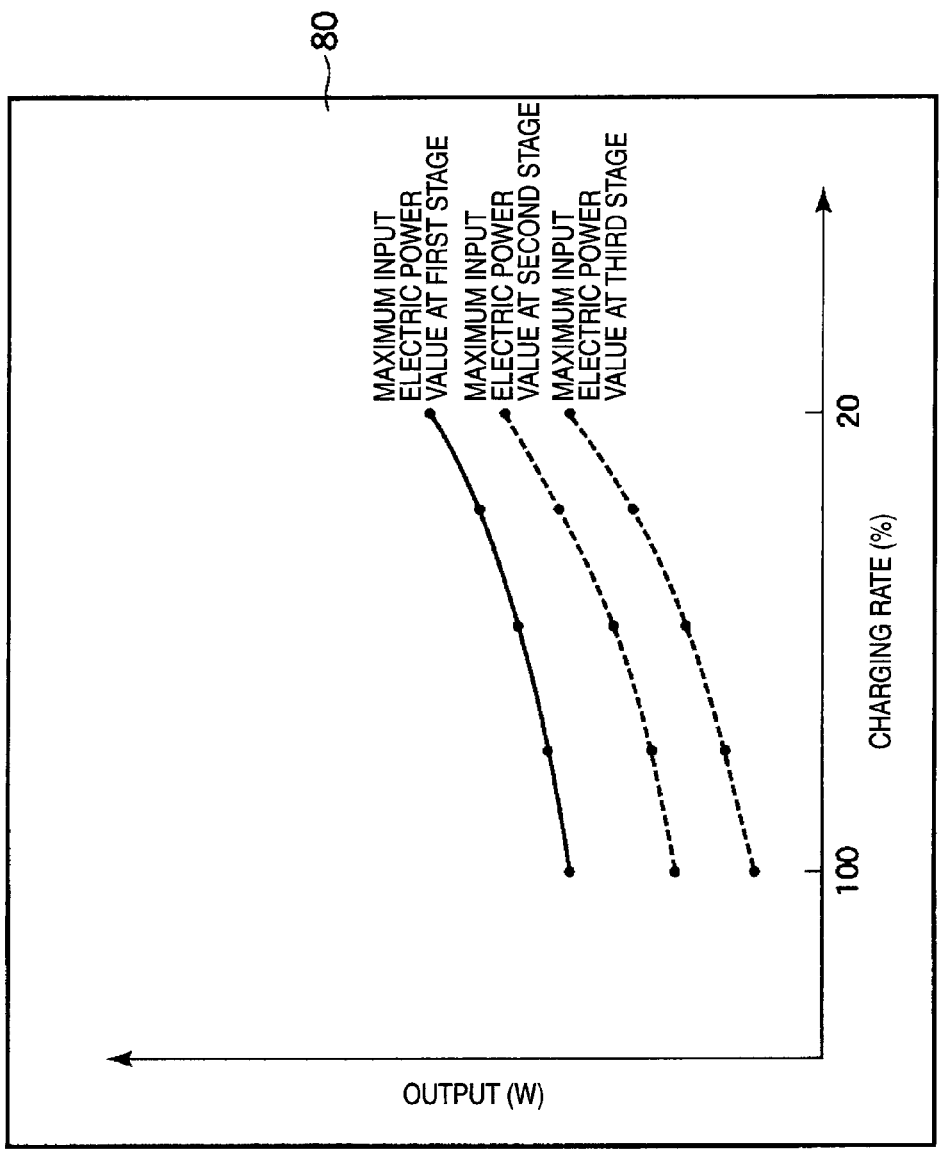
FIG. 28 is a graph showing an input control map of the embodiment.

FIG. 28 shows an input control map 80 in the fifth state. In FIG. 28, a maximum input electric power value corresponding to a charging rate of the input control map 80 in an initial state is indicated by a solid line. The initial state of the input control map 80 means a period of time which lasts from a state in which the battery 14 (battery cells 16) has not yet deteriorated until the first determination of deterioration is made. Namely, the initial state denotes the first stage. Axes of abscissas and ordinates of the output control map 80 are the same as those of the first to third input control map groups 51 to 53.

The battery management control unit 250 determines at step ST3 that the battery cell 16 has deteriorated and then at step ST5 multiplies the maximum output electric power value in the initial state by a predetermined gain value so as to correct the maximum output electric power value shown on the map to a maximum output electric power value which corresponds to the deterioration stage.

Specifically, an initial value (indicated by the solid line, and as an example, the initial value in the fifth state is shown in the graph) is used as a maximum output electric power value in the output control map 70 until before a first determination of deterioration is made at step ST3. When the first determination of deterioration is made at step ST3, at step ST5, the deteriorating state of the battery 14 is changed to a second stage, and the initial value of the maximum output electric power value is multiplied by a predetermined gain, for example, 0.8 which is associated with the second stage. In this way, the maximum output electric value is corrected in such a manner as to be associated with the second stage. In the figure, a maximum output electric power value in the fifth state of the second stage is indicated by a dotted line for comparison.

Similarly, when a second determination of deterioration is made, at step ST5, the deteriorating state is changed to a third stage, and the initial value of the maximum output electric power value is multiplied by a predetermined gain, for example, 0464 which is associated with the third stage. In this way, the maximum output electric value is corrected in such a manner as to be associated with the third stage. In the figure, a maximum output electric power value in the fifth state of the third stage is indicated by a dotted line for comparison.

Similarly, in the output control map 70, every time the determination of deterioration is made, the maximum output electric power value in the initial state is multiplied by the predetermined gain value to thereby correct the maximum output electric power value for update.

Note that FIGS. 27 and 28 show the maximum output electric power values and the maximum input electric power values in the fifth state of the first to third stages in this embodiment, too, the maps are prepared to match first to fifth states in the first to third stages. The maximum input and output values in the first to fifth states are multiplied by the predetermined gain values (0.8 and 0.64) so as to be associated with temperatures at the respective stages. In addition, within the same stage, data is corrected to match the respective temperature conditions.

Figure 29:
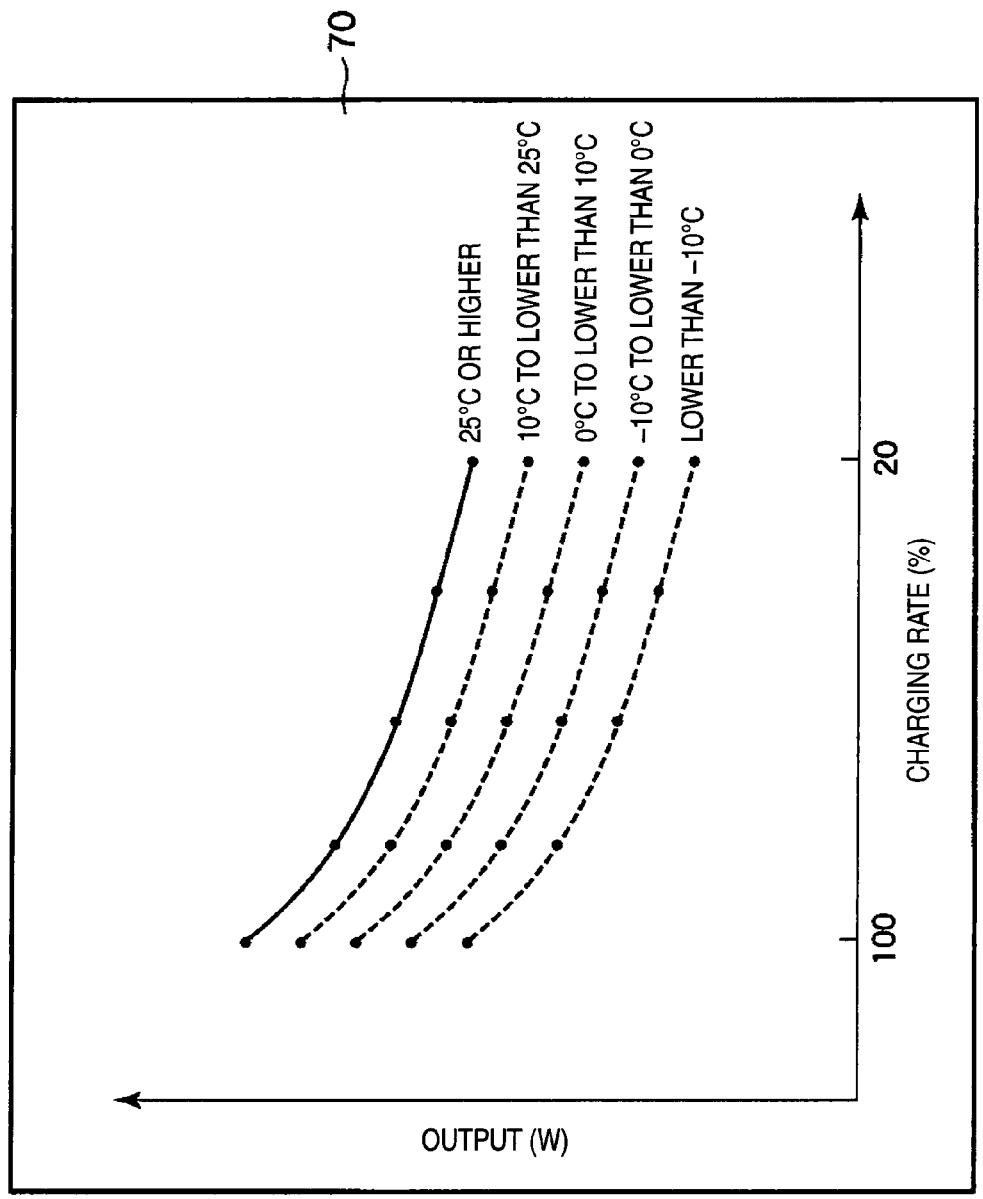
FIG. 29 is a graph showing first to fifth states of the output control map shown in FIG. 27.
Figure 30:
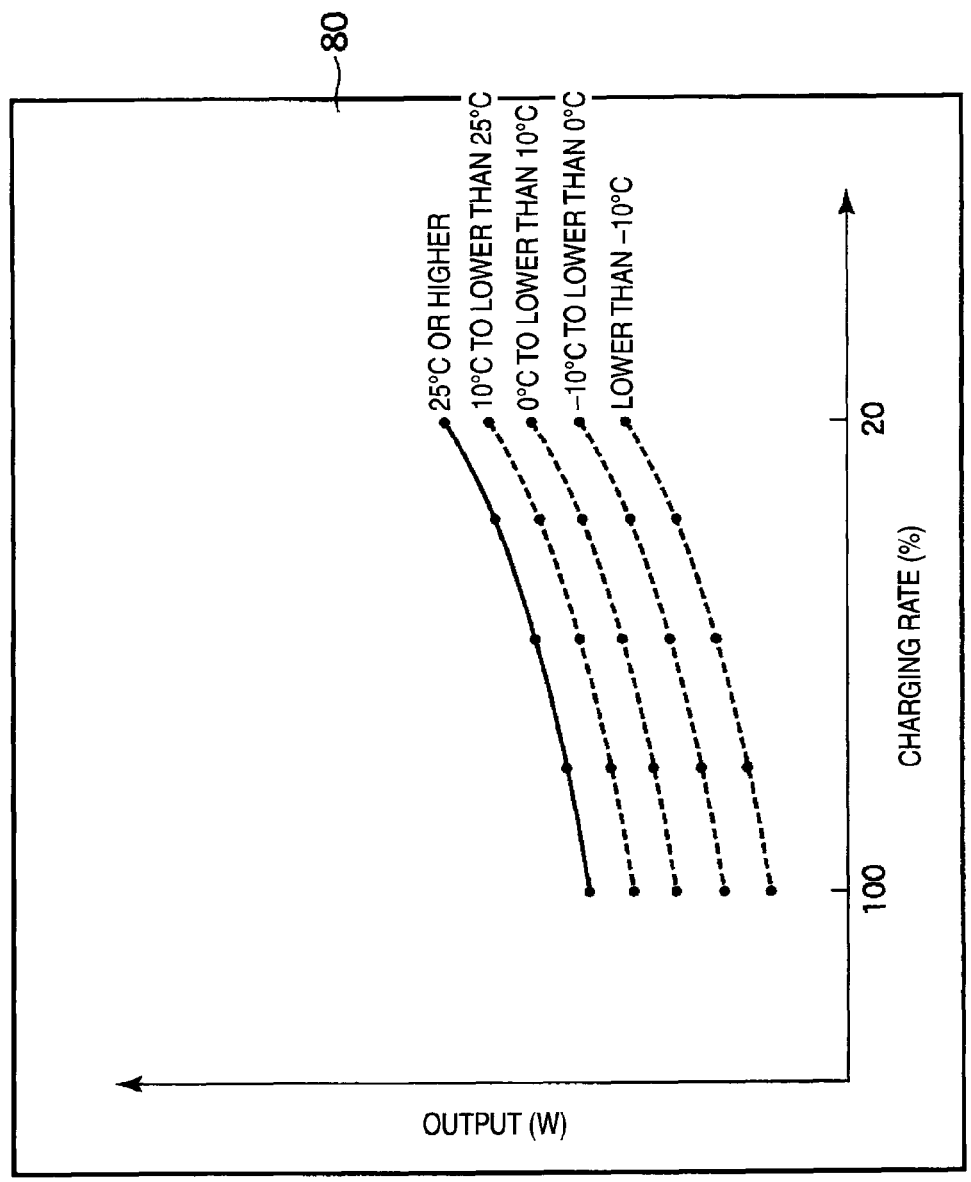
FIG. 30 is a graph showing first to fifth states of the input control map shown in FIG. 28.

As an example, FIG. 29 shows values (values after correction) which are used in the first to fifth states in the first stage of the output control map 70. FIG. 30 shows values (values after correction) which are used in the first to fifth states in the first stage of the input control map 80. The battery management unit 250 corrects the maximum input and output electric power values which are shown on the maps in association with the temperature of the battery 14 and shows the corrected values on the maps. In this case, for example, the maximum input and output electric power values in the fifth state may be made to be multiplied by the predetermined gain values which are used for correction to the respective states.

Also at the second and third stages, data is corrected for use in a similar way to that used in FIGS. 20, 30. This embodiment also obtains the same advantage as that obtained by the first embodiment.

In addition, while 0.8 is used as the predetermined gain value which is used to associate the maximum input and output electric power values with the second deterioration stage and 0.64 is used as the predetermined gain value which is used to associate the maximum input and output electric power values with the third deterioration stage, the invention is not limited thereto. In addition, different predetermined gain values may be used for the output control map 70 and the input control map 80.

In addition, also in the second to seventh embodiments, instead of the first to third input and output control map groups 41 to 43, 51 to 53, an output control map 70 and an input control map 80 which are similar to those of the embodiment may be used. Also in this case, the same advantage can be obtained which is the same as those obtained in the second to seventh embodiments.

Additionally, also in the eighth embodiment, instead of the first to third input and output control map groups 41 to 43, 51 to 53 which are possessed by the electric vehicle control unit 200, the input and output control maps 70, 80 of this embodiment may be used. As this occurs, when the battery management unit 250 requests the electric vehicle control unit 200 to update the maps, the electric vehicle control unit 200 corrects the maps in such a manner as to be associated with the deterioration stage and temperature zone for update by multiplying the maximum input and output electric power values by the predetermined gain value.

In addition, in the first to ninth embodiments, as an example, the battery 14 is made to be determined as having deteriorated when any one of the plurality of battery cells 16 or any predetermined plural number (which is preset) of battery cells 16 of the plurality of battery cells 16 attain the deterioration determination conditions (which were described in the respective embodiments) a plurality of times (when the deterioration determination conditions are satisfied so many times).

For example, the battery 14 is determined as having deteriorated in the event that the output voltage value of the battery cell 16 becomes smaller than the lower limit voltage value a plurality of times, in the event that the input voltage value into the battery cell 16 becomes larger than the upper limit voltage value, or/and in the event that it is determined a plurality of times that the maximum input and output electric power values cannot continuously be inputted into and outputted from the battery 14.

However, the invention is not limited to the constitution where the number of times of determination of deterioration is held, so that the battery 14 is determined to have deteriorated when the number of times of determination of deterioration reaches the predetermined number of times (once, several times) or exceeds the predetermined number of times.

For example, the battery 14 may be determined to have deteriorated when any predetermined number (which includes one, or a plural number such as two or three and which is a preset number) of battery cells 16 of the plurality of battery cells 16 satisfy the deterioration determination condition/s a preset predetermined number of times within a preset predetermined period of time. As this occurs, the number of times of the deterioration determination condition/s being reached is not accumulated, and when a predetermined period of time elapses, the number of times of the deterioration determination condition/s being reached returns to zero.

According to an aspect of the invention, the maps are not changed based on the estimation of deteriorations of the battery cells but are changed when actual deteriorations of the battery cells are determined.

According to an aspect of the invention, the deterioration of the battery can be determined with good efficiency.

According to an aspect of the invention, the maps by temperature can be used based on temperatures detected.

According to an aspect of the invention, the battery can be controlled by the use of an optimum map.

In this invention, since the maps are not changed by the estimation of a deterioration of the battery but are changed when an actual deterioration thereof is detected, it is possible to suppress the occurrence of a difference between the performance of the battery shown on the maps and the actual performance of the battery.

What is claimed is:

1. A battery management control system, provided in an electric vehicle which is provided with electronic equipment including at least a driving electric motor, the battery management control system comprising:
   a battery, comprising:
      a battery cell;
      a battery cell monitor, configured to detect information on the battery cell; and
      a manager, configured to control input and output of electric power to and from the battery cell based on the information; and
   a controller, connected to the electronic equipment, wherein:
   one of the manager and the controller includes a map including a first map which specifies a relationship between a charging rate and a first limit of the electric power and a second map which specifies a relationship between the charging rate and a second limit of the electric power lower than the first limit;
   the controller calculates a first electric power value based on the first map and requests the calculated first electric power value from the manager; and
   when the manager controls the input and the output of the electric power to and from the battery cell based on the requested first electric power value, and the information detected by the battery cell monitor satisfies a deterioration determination condition at least one time, the manager determines that the battery cell is deteriorated, and the controller calculates a second electric power value based on the second map,
   wherein the deterioration determination condition includes,
   that the maximum input and output electric powers based on the map are not to be held for a period of time.

2. The battery management control system according to claim 1, wherein
   the manager includes the map; and
   when the manager determines that the battery cell is deteriorated, the manager changes the first map to the second map.

3. The battery management control system according to claim 1, wherein
   the controller includes the map; and
   when the manager determines that the battery cell is deteriorated, the manager outputs a request to the controller to change the first map, and the controller changes the first map to the second map in response to the request.

4. The battery management control system according to claim 1, wherein
   the information detected by the battery cell monitor includes voltage and temperature of the battery cell.

5. The battery management control system according to claim 1, wherein
   the map includes a plurality of maps in accordance with degree of deterioration of the battery cell.

6. The battery management control system according to claim 1, wherein
   the map includes a third map which indicates maximum electric power input and output values corresponding to a charging rate of the battery cell which is not deteriorated, and a fourth map which indicates maximum electric power input and output values corrected by multiplying the maximum electric power input and output values indicated by the third map by a gain in accordance with degree of deterioration of the battery cell.

7. The battery management control system according to claim 1, wherein
   the charging rate is an amount or residual electric energy of the battery cell.

8. The battery management control system according to claim 1, wherein
   the controller is electrically connected to an accelerator pedal.

9. The battery management control system according to claim 1, wherein
   the battery cell monitor detects an amount of residual electric energy of the battery cell.

10. A battery management control system, provided in an electric vehicle which is provided with electronic equipment including at least a driving electric motor, the battery management control system comprising:
  a battery including,
    a battery cell,
    a battery cell monitor, configured to detect information on the battery cell, and
    a manager, configured to control input and output of electric power to and from the battery cell based on the information, and
    a controller, connected to the electroic equipment, and configured to calculate a desired electric power for the electronic equipment, wherein
  one of the manager and the controller includes a map including a first map which specifies a relationship between a charging rate and a first limit of the electric power and a second map which specifies a relationship between the charging rate and a second limit of the electric power lower than the first limit,
  the controller determines whether the desired electric power exceeds the first limit in accordance with the first map,
  the controller requests the desired electric power as a first electric power value to the manager when the desired electric power does not exceed the first limit, and requests the first limit of the electric power as the first electric power value to the manager when the desired electric power exceeds the first limit, and
  the manager controls the input and the output of the electric power to and from the battery cell based on the requested first electric power value,
  the manager determines whether the information detected by the battery cell monitor satisfies a deterioration determination condition,
  when the manager determines that the deterioration determination condition of the battery cell is satisfied at least one time, the controller determines whether the desired electric power exceeds the second limit in accordance with the second map,
  wherein the deterioration determination condition includes that maximum input and output electric powers based on the map are not to be held for a period of time.

11. The battery management control system according to claim 10, wherein
  the battery manager include the map, and
  when the manager determined that the battery cell is deteriorated by the satisfaction of the deterioration determination condition, the manager changes the first map to the second map.

12. The battery management control system according to claim 10, wherein
  the controller includes the map, and
  when the manager determines that the battery cell is deteriorated by the satisfaction of the deterioration determination condition, the manager outputs a request to the controller to change the first map, and the controller changes the first map to the second map in response to the request.

13. The battery management control system according to claim 10, wherein
  the deterioration determination condition further includes at least one of the conditions
    that an input voltage to the battery cell detected by the battery cell monitor as the information larger than an upper limit voltage value in the input of the electric power to the battery cell, and
    that an output voltage from the battery cell detected by the battery cell monitor as the information is smaller than a lower limit voltage value in the output of the electric power from the battery cell.

14. The battery management control system according to claim 10, wherein
  the information detected by the battery cell monitor includes voltage and temperature of the battery cell.

15. The battery management control system according to claim 10, wherein
  the map includes a plurality of maps in accordance with degree of deterioration of the battery cell.

16. The battery management control system according to claim 10, wherein
  the map includes a third map which indicates maximum electric power input and output values corresponding to a charging rate of the battery cell which is not deteriorated, and a fourth map which indicates maximum electric power input and output values corrected by multiplying the maximum electric power input and output values indicated by the third map by a gain in accordance with degree of deterioration of the battery cell.

17. The battery management control system according to claim 10, wherein
  the charging rate is an amount or residual electric energy of the battery cell.

18. The battery management control system according to claim 10, wherein
  the controller is electrically connected to an accelerator pedal.

19. The battery management control system according to claim 10, wherein
  the battery cell monitor detects an amount of residual electric energy of the battery cell.

* * * * *